(12) United States Patent
Fulford et al.

(10) Patent No.: US 12,040,236 B2
(45) Date of Patent: Jul. 16, 2024

(54) 3D DEVICES WITH 3D DIFFUSION BREAKS AND METHOD OF FORMING THE SAME

(71) Applicant: Tokyo Electron Limited, Tokyo (JP)

(72) Inventors: H. Jim Fulford, Marianna, FL (US); Mark I. Gardner, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 345 days.

(21) Appl. No.: 17/480,336

(22) Filed: Sep. 21, 2021

(65) Prior Publication Data

US 2022/0254690 A1 Aug. 11, 2022

Related U.S. Application Data

(60) Provisional application No. 63/147,455, filed on Feb. 9, 2021, provisional application No. 63/147,290, filed
(Continued)

(51) Int. Cl.
*H01L 21/8234* (2006.01)
*H01L 21/8238* (2006.01)
*H01L 29/06* (2006.01)
*H01L 29/417* (2006.01)
*H01L 29/423* (2006.01)
(Continued)

(52) U.S. Cl.
CPC ........... *H01L 21/823487* (2013.01); *H01L 21/823878* (2013.01); *H01L 21/823885* (2013.01); *H01L 29/0653* (2013.01); *H01L 29/0676* (2013.01); *H01L 29/41741* (2013.01); *H01L 29/42392* (2013.01); *H01L 29/66666* (2013.01); *H01L 29/7827* (2013.01); *H01L 29/7831* (2013.01)

(58) Field of Classification Search
None
See application file for complete search history.

(56) References Cited

U.S. PATENT DOCUMENTS 7,638,381 B2 12/2009 Cheng et al.
8,378,415 B2 2/2013 Higashino
(Continued)

OTHER PUBLICATIONS

International Search Report and Written Opinion mailed on May 19, 2022 issued in PCT/US2022/014953 filed on Feb. 2, 2022, total 11 pages.
(Continued)

*Primary Examiner* — Hsien Ming Lee
(74) *Attorney, Agent, or Firm* — Oblon, McClelland, Maier & Neustadt, L.L.P.

(57) ABSTRACT

A method of microfabrication is provided. The method includes forming shell structures above a first layer including a first semiconductor material. The shell structures are electrically isolated from each other and electrically isolated from the first layer. The shell structures include at least one type of semiconductor material and each include a dielectric core structure. Each shell structure is configured to include a top source/drain (S/D) region, a channel region and a bottom S/D region serially connected in a vertical direction perpendicular to the first layer and have a current flow path in the vertical direction. A bottom contact structure connected to a respective bottom S/D region of each shell structure is formed. A gate structure is formed on a sidewall of a respective channel region of each shell structure.

20 Claims, 16 Drawing Sheets

Related U.S. Application Data on Feb. 9, 2021, provisional application No. 63/147,454, filed on Feb. 9, 2021.

(51) Int. Cl.
*H01L 29/66* (2006.01)
*H01L 29/78* (2006.01)

(56) References Cited

U.S. PATENT DOCUMENTS

| | | |
|---|---|---|
| 8,710,566 B2 | 4/2014 | Ellis et al. |
| 8,866,266 B2 | 10/2014 | Tekleab et al. |
| 8,871,576 B2 | 10/2014 | Tekleab et al. |
| 9,064,730 B2 | 6/2015 | Ellis et al. |
| 9,530,781 B2 | 12/2016 | Miyamoto et al. |
| 9,711,532 B2 | 7/2017 | Miyamoto et al. |
| 10,431,628 B2 | 10/2019 | Kim et al. |
| 2013/0140628 A1 | 6/2013 | Higashino |
| 2021/0327881 A1* | 10/2021 | Tang ............ H10B 12/30 |

OTHER PUBLICATIONS

International Preliminary Report on Patentability completed on May 18, 2022 issued in PCT/US2022/014953 filed on Feb. 2, 2022, total 7 pages.

* cited by examiner

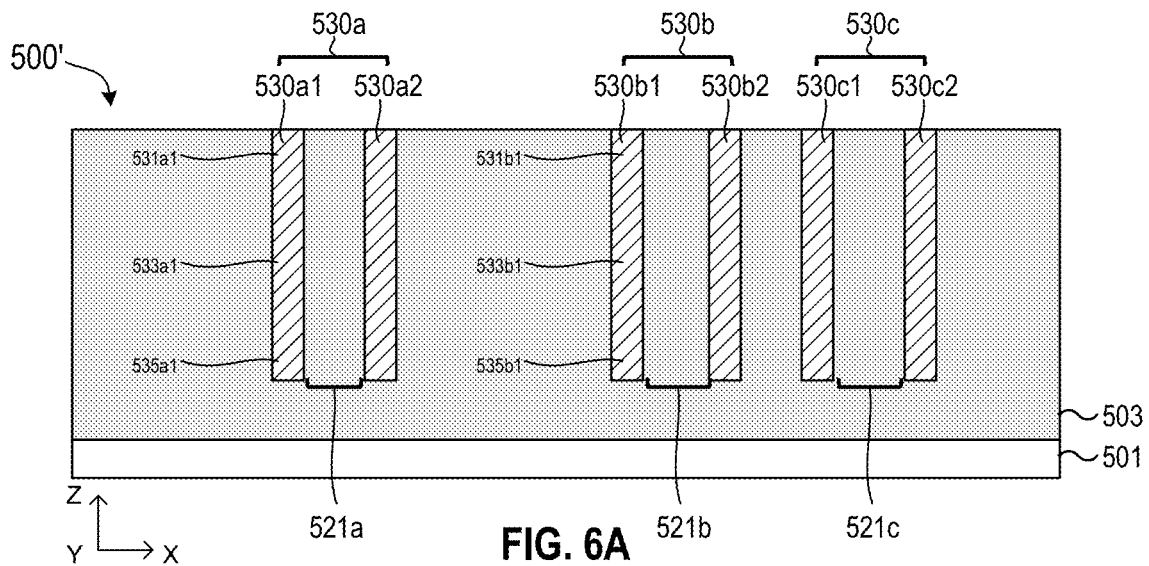
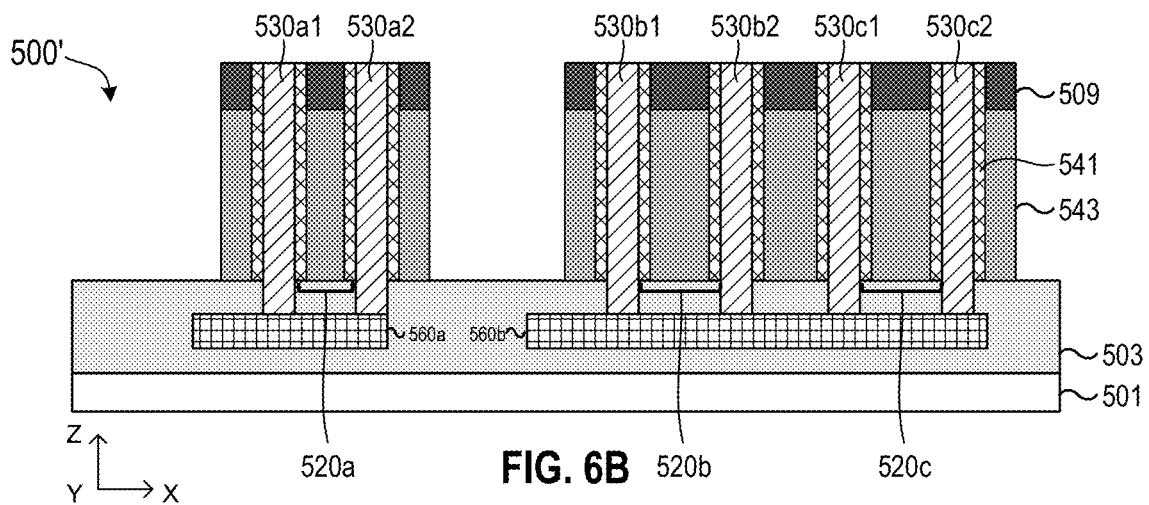
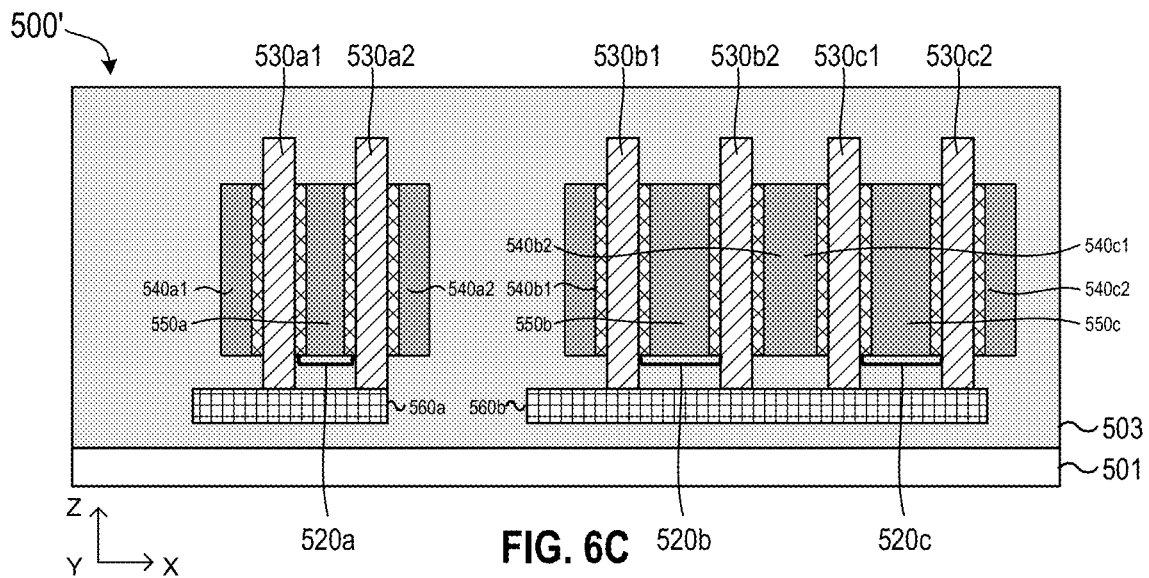

3D DEVICES WITH 3D DIFFUSION BREAKS AND METHOD OF FORMING THE SAME

INCORPORATION BY REFERENCE

This present disclosure claims the benefit of U.S. Provisional Applications Nos. 63/147,290, 63/147,454 and 63/147,455 filed on Feb. 9, 2021, each of which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device and a method of microfabrication.

An aspect (1) includes a method of microfabrication. The method includes forming shell structures above a first layer including a first semiconductor material. The shell structures are electrically isolated from each other and electrically isolated from the first layer. The shell structures include at least one type of semiconductor material and each include a dielectric core structure. Each shell structure is configured to include a top source/drain (S/D) region, a channel region and a bottom S/D region serially connected in a vertical direction perpendicular to the first layer and have a current flow path in the vertical direction. A bottom contact structure connected to a respective bottom S/D region of each shell structure is formed. A gate structure is formed on a sidewall of a respective channel region of each shell structure.

An aspect (2) includes the method of aspect (1), wherein the forming the bottom contact structure includes forming an opening along a respective sidewall of each shell structure to expose a respective bottom S/D region of each shell structure. Each opening is filled with a conductive material such that a bottom portion of the conductive material is in contact with the respective bottom S/D region. A top portion of the conductive material is removed so that the bottom portion of the conductive material forms the bottom contact structure.

An aspect (3) includes the method of aspect (1), wherein the forming the gate structure includes exposing top S/D regions and channel regions of the shell structures. Gate stacks are formed around the channel regions. Sidewall spacers are formed around the top S/D regions. Excessive portions of the gate stacks are removed at least partially using the sidewall spacers as an etching mask so that remaining portions of the gate stacks form the gate structures.

An aspect (4) includes the method of aspect (3), further including removing a dielectric material that is positioned on an outer sidewall of at least one shell structure to expose a respective top S/D region and a respective channel region from outside. An outer gate structure is formed on an outer sidewall of the respective channel region.

An aspect (5) includes the method of aspect (3), further including removing the dielectric core structure of at least one shell structure to expose a respective top S/D region and a respective channel region from inside. An inner gate structure is formed on an inner sidewall of the respective channel region.

An aspect (6) includes the method of aspect (3), further including depositing at least one high-k dielectric of the gate stacks around the channel regions and the top S/D regions. At least one work function metal (WFM) of the gate stacks is deposited, around the channel regions, on the high-k dielectric. The sidewall spacers are formed around the top S/D regions. The excessive portions of the at least one WFM are removed at least partially using the sidewall spacers as the etching mask.

An aspect (7) includes the method of aspect (1), wherein the forming the shell structure includes forming at least one continuous shell structure surrounding a sidewall of a respective dielectric core structure such that the continuous shell structure forms a closed shape in a plane parallel to the first layer.

An aspect (8) includes the method of aspect (7), further including forming an outer gate structure all around an outer sidewall of a respective channel region of the continuous shell structure.

An aspect (9) includes the method of aspect (8), further including forming an inner gate structure all around an inner sidewall of the respective channel region of the continuous shell structure.

An aspect (10) includes the method of aspect (9), further including forming a conductive structure to electrically connect the outer gate structure and the inner gate structure of the respective channel region of the continuous shell structure.

An aspect (11) includes the method of aspect (1), wherein the forming the shell structure includes forming at least one discontinuous shell structure including independent sub-shell structures extending around a sidewall of a respective dielectric core structure such that the discontinuous shell structure forms a broken shape in a plane parallel to the first layer. Each sub-shell structure is configured to include a channel region.

An aspect (12) includes the method of aspect (11), further including forming an outer gate structure on an outer sidewall of a respective channel region of at least one sub-shell structure.

An aspect (13) includes the method of aspect (12), further including forming an inner gate structure on an inner sidewall of the respective channel region of the sub-shell structure.

An aspect (14) includes the method of aspect (13), further including forming the outer gate structure and the inner gate structure so that the outer gate structure and the inner gate structure are in contact and together surround the respective channel region of the sub-shell structure.

An aspect (15) includes the method of aspect (13), further including forming outer gate structures and inner gate structures on sidewalls of channel regions of an array of sub-shell structure so that neighboring inner gate structures merge to form common gate structures for neighboring channel regions and neighboring outer gate structures merge to form common gate structures for neighboring channel regions.

An aspect (16) includes the method of aspect (1), wherein the forming the gate structure includes forming a first group of gate structures on respective channel regions of a first group of the shell structures and a second group of gate structures on respective channel regions of a second group of the shell structures. The first group of gate structures and the second group of gate structures include different gate stacks. The first group of the shell structures and the second group of the shell structures include different semiconductor materials, or the first group of the shell structures and the second group of the shell structures include a same semiconductor material but are doped differently.

An aspect (17) includes the method of aspect (16), further including stepwise masking and uncovering the first group of the shell structures and the second group of the shell structures to form the first group of gate structures and the second group of gate structures.

An aspect (18) includes the method of aspect (17), further including forming the first group of gate structures on the respective channel regions of the first group of the shell structures to create NMOS transistors. The second group of gate structures is formed on the respective channel regions of the second group of the shell structures to create PMOS transistors. The first group of the shell structures has a different semiconductor material from the second group of the shell structures.

An aspect (19) includes the method of aspect (1), further including forming first conductive structures configured to connect top S/D regions of the shell structures and gate structures to at least one of a front-side power delivery network (FSPDN) or a backside power delivery network (BSPDN). Second conductive structures configured to connect to bottom contact structures are formed so that bottom S/D regions are configured to connect to at least one of the FSPDN or the BSPDN via respective second conductive structures and bottom contact structures.

An aspect (20) includes the method of aspect (1), wherein the forming the shell structures includes providing a substrate having the first layer. A second layer of a second semiconductor material is formed over the first layer. The second layer is directionally etched using a mask to form independent core structures of the second semiconductor material on the first semiconductor material. Each independent core structure has a sidewall extending from an exposed surface of the first layer. A third layer of a dielectric material is formed on the exposed surface of the first layer to cover a lower portion of a respective sidewall of each core structure with the dielectric material. A shell structure is formed on an upper portion of a respective sidewall of each core structure to form the shell structures. The core structures are replaced with an insulating material to form the dielectric core structure of each shell structure.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 2A' shows a horizontal cross-sectional view taken along the line cut BB' in FIG. 2A, in accordance with one embodiment of the present disclosure.

FIGS. 6A, 6B and 6C show vertical cross-sectional views of a semiconductor device at various intermediate steps of manufacturing, in accordance with yet another embodiment of the present disclosure.

FIG. 8A' shows a horizontal cross-sectional view taken along the line cut DD' in FIG. 8A, in accordance with yet another embodiment of the present disclosure.

DETAILED DESCRIPTION

Figure 1A:
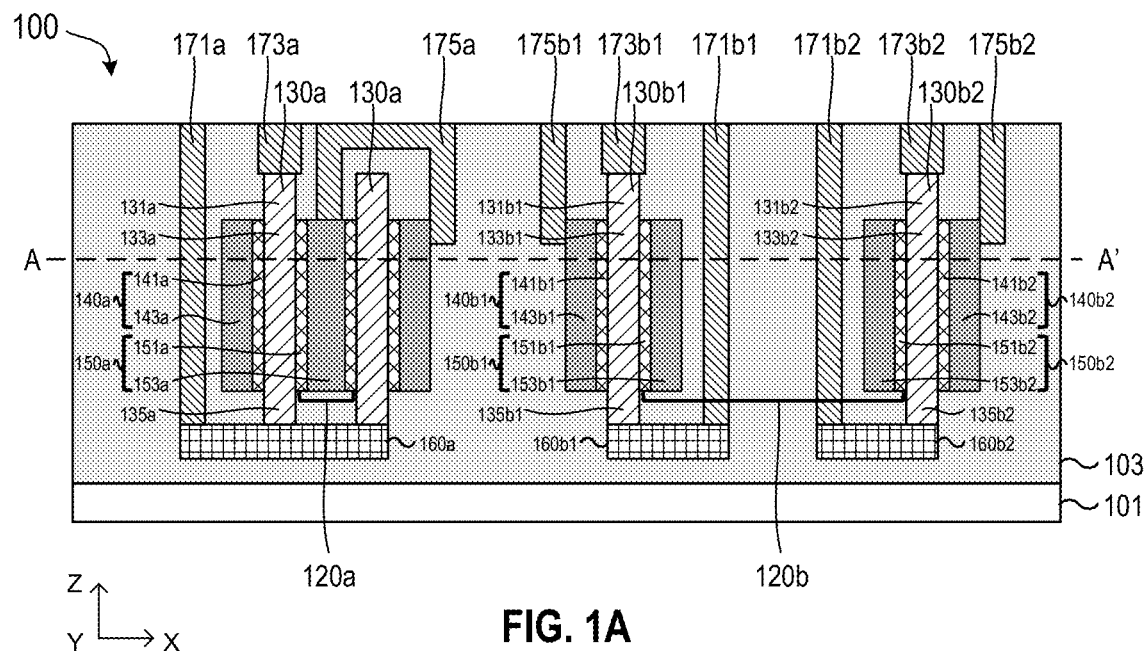
FIG. 1A shows a vertical cross-sectional view of a semiconductor device, in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (e.g. CPU (central processing unit), GPU (graphics processing unit), FPGA (field programmable gate array, SoC (System on a chip), etc.) is being pursued.

Techniques herein include 3D vertical transistors made with a vertical disposable cavity to enable both sides of the 360 degree epitaxial shell or vertical nanosheet to have a gate oxide and gate electrode for shorted gate cores. Any type of epitaxial semiconductor material of a shell (e.g. a cylindrical shell) can be made with techniques herein by placing two epitaxial layers together that are etch selective (obtained by the sequence of semiconductors A and B). Techniques herein enable multiple vertical transistors to be tied together (both S/D and gate regions) for advanced circuit layout options to provide for a wide range of high performance devices. Also enabled are methods to make a dielectric core for 3D vertical isolation in some regions of the wafer and a shorted gate core in other regions for additional drive strength. A new connection for a source hookup is shown that allows buried power rail (BPR) hookup from either above the 3D device or below the 3D device (e.g. a substrate BPR option) for better circuit layout optimization.

Techniques herein include 3D vertical transistors made with a vertical disposable cavity to control precise 3D high mobility materials to enable high performance devices. Any type of epitaxial semiconductor material can be used to form cylindrical, rectangular or ellipsoid shell devices. Such shells can be made by placing two or more epitaxial layers together that are etch selective (obtained by the sequence of semiconductors A and B). Techniques herein also include a shell that has semiconductor C different from semiconductor A or semiconductor B, with multiple material types possible on the same substrate. That is, a shell can include a different semiconductor material from an underlying semiconductor layer. Techniques herein include a method to make a dielectric core for 3D vertical isolation and horizontal isolation for high performance devices.

According to some aspects of the present disclosure, techniques herein use a method to make vertical 3D semiconductor nanosheets (or shell structures) with 3D vertical and horizontal diffusion breaks, as disclosed in the applicant's patent application titled "METHOD OF MAKING VERTICAL SEMICONDUCTOR NANOSHEETS WITH DIFFUSION BREAKS", which is incorporated herein by reference in its entirety.

Techniques herein include using the 3D vertical nanosheets to make high performance 3D CMOS (complementary metal-oxide-semiconductor) vertical transistors with this device architecture using shorted gate cores for NMOS (n-type metal-oxide-semiconductor) and PMOS (p-type metal-oxide-semiconductor). Examples include flows with SOI (silicon-on-insulator) core integration as well as shorted gate cores with device hookup (one device tall). Techniques herein also include using the 3D vertical nanosheets to create 3D CMOS vertical transistors, in that such transistors have a channel with a vertical current path relative to a surface of the substrate or wafer.

Figure 1B:
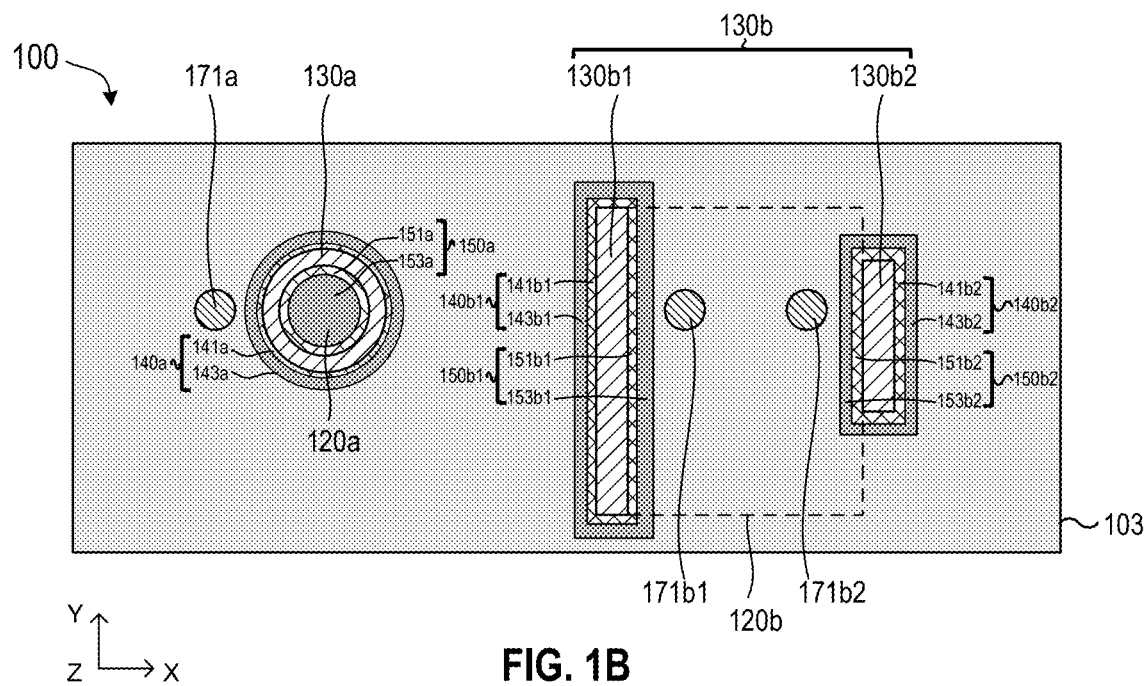
FIG. 1B shows a horizontal cross-sectional view taken along the line cut AA' in FIG. 1A, in accordance with one embodiment of the present disclosure.

FIG. 1A shows a vertical cross-sectional view of a semiconductor device 100, in accordance with one embodiment of the present disclosure. FIG. 1B shows a horizontal cross-sectional view taken along the line cut AA' in FIG. 1A, in accordance with one embodiment of the present disclosure. As shown, the semiconductor device 100 includes a first layer 101 that includes a first semiconductor material. Vertical transistor devices can be disposed above the first layer 101 with vertical barrier breaks in between. The vertical transistor devices can also have horizontal barrier breaks between each other.

Particularly, shell structures (e.g. 130a and 130b) are positioned above and electrically isolated from the first layer 101 by a dielectric material 103. The shell structures include at least one type of semiconductor material. Each shell structure (e.g. 130a) is configured to include a channel region (e.g. 133a) oriented in a vertical direction (e.g. in the z direction) perpendicular to the first layer 101 and have a current flow path in the vertical direction. In some embodiments, at least one shell structure (e.g. 130a) is configured to include a top source/drain (S/D) region (e.g. 131a), a channel region (e.g. 133a) and a bottom S/D region (e.g. 135a) serially connected in the vertical direction. While shown to have no junction in the examples of FIGS. 1A and 1B, the top S/D region 131a, the channel region 133a and the bottom S/D region 135a can also be connected with junctions in alternative examples.

The semiconductor device 100 also includes gate structures, e.g. an outer gate structure (e.g. 140a) positioned on an outer sidewall of a respective channel region (e.g. 133a) of each shell structure (e.g. 130a). The semiconductor device 100 further includes an inner structure (e.g. 120a) positioned on an inner sidewall of a respective channel region (e.g. 133a) of each shell structure (e.g. 130a). In some embodiments, an inner structure (e.g. 120a) includes an inner gate structure (e.g. 150a) of the gate structures, positioned on the inner sidewall of the respective channel region (e.g. 133a), which will be explained in greater detail later. Note that each shell structure (e.g. 130a) and one or more respective gate structures (e.g. 140a and 150a) can be configured to function as a vertical transistor device having a current flow path in the vertical direction.

In some embodiments, the shell structures include at least one continuous shell structure (e.g. 130a) surrounding a sidewall of a respective inner structure (e.g. 120a), and the continuous shell structure (e.g. 130a) forms a closed shape in a plane (e.g. in the xy plane) parallel to the first layer 101. The closed shape can be circular, elliptical, polygonal or any other irregular closed shape. Accordingly, shapes of inner structures (e.g. 120a) include prisms having horizontal bases and vertical faces, and the horizontal bases can be circular, elliptical or polygonal. In this example, the continuous shell structure 130a has a circular shape in the xy plane. The outer gate structure 140a surrounds an outer sidewall of the channel region 133a of the continuous shell structure 130a while the inner gate structure 150a is surrounded by an inner sidewall of the channel region 130a, thus forming a gate-all-around (GAA) transistor. Having two gate structures inside and outside the circular shape can increase current capacity. In one example, the outer gate structure 140a and the inner gate structure 150a are electrically connected to be configured at a same electric potential. In another example, the outer gate structure 140a and the inner gate structure 150a are configured at different electric potentials and independently controlled.

Further, each gate structure (e.g. 140a and 150a) includes a gate stack having at least one high-k dielectric (e.g. 141a and 151a) and at least one work function metal (WFM) (e.g. 143a and 153a). The at least one high-k dielectric (e.g. 141a) is positioned between the at least one WFM (e.g. 143a) and a respective channel region (e.g. 133a). In the examples of FIGS. 1A and 1B, the high-k dielectrics 141a and 151a include a same high-k dielectric, and the WFMs 143a and 153a include a same WFM.

In some embodiments, the shell structures include at least one discontinuous shell structure (e.g. 130b) including independent sub-shell structures (e.g. 130b1 and 130b2) extending around a sidewall of a respective inner structure (e.g. 120b). FIG. 1B shows the inner structure 120b as a dashed line rectangle after removal of a (sacrificial) core structure used to create the discontinuous shell structure 130b. The discontinuous shell structure (e.g. 130b) forms a broken shape in the plane parallel to the first layer 101, and each sub-shell structure (e.g. 130b1) is configured to include a channel region (e.g. 133b1). The respective inner structure (e.g. 120b) can be polygonal in the plane parallel to the first layer 101, and the sub-shell structures (e.g. 130b1 and 130b2) can be formed on different sides of a respective polygon. In this example, the sub-shell structures 130b1 and 130b2 are formed on opposing sides of a rectangle or a trapezoid. The sub-shell structures 130b1 and 130b2 may or may not have a same length in the y direction in the xy plane.

Similarly, outer gates structures 140b1 and 140b2 are positioned on outer sidewalls of channel regions 133b1 and 133b2 respectively of the sub-shell structures 130b1 and 130b2. The inner structure 120b includes inner gate structures 150b1 and 150b2 positioned on inner sidewalls of the channel regions 133b1 and 133b2 respectively. In the examples of FIGS. 1A and 1B, an outer gate structure (e.g. 140b1) and an inner gate structure (e.g. 150b1) of a particular channel region (e.g. 133b1) are in contact to form a GAA structure. Further, the inner structure 120b includes a dielectric isolation (e.g. the dielectric material 103) between the sub-shell structures 130b1 and 130b2, or rather between the inner gate structures 150b1 and 150b2.

In some embodiments, the semiconductor device 100 further includes conductive structures configured to connect top S/D regions and bottom S/D regions of the shell structures and the gate structures to at least one of a front-side power delivery network (FSPDN, not shown) or a backside power delivery network (BSPDN, not shown). For instance, conductive structures 173a, 173b1 and 173b2 connect top S/D regions 131a, 131b1, and 131b2 to an FSPDN respectively. In one example, an outer gate structure (e.g. 140a) and a respective inner gate structure (e.g. 150a) are spaced apart but electrically connected by a respective conductive structure (e.g. 175a) to the FSPDN and form a shorted gate core region. In another example, an outer gate structure (e.g. 140b1) and a respective inner gate structure (e.g. 150b1) are in contact and form a GAA structure, around which a respective conductive structure (e.g. 175b1) can be positioned anywhere.

In this example, bottom contact structures 160a, 160b1 and 160b2 are positioned below and in contact with bottom S/D regions 135a, 135b1 and 135b2 respectively. The bottom contact structures 160a, 160b1 and 160b2 can be configured as buried power rails (BPRs) or configured to connect to BPRs. In one embodiment, the bottom contact structures 160a, 160b1 and 160b2 connect the bottom S/D regions 135a, 135b1 and 135b2 respectively to an FSPDN via conductive structures 171a, 171b1 and 171b2. The conductive structures 171a, 171b1 and 171b2 may include through-silicon vias. In another embodiment, while not shown, the bottom contact structures 160a, 160b1 and 160b2 connect the bottom S/D regions 135a, 135b1 and 135b2 respectively to a BSPDN. Accordingly, the conductive structures 171a, 171b1 and 171b2 may be disposed below the bottom contact structures 160a, 160b1 and 160b2. Note that each bottom contact structure (e.g. 160b1) can extend horizontally from a respective bottom S/D region (e.g. 135b1) to a respective conductive structure (e.g. 171b1). Thus, each bottom contact structure (e.g. 160b1) can be positioned below or adjacent to the respective bottom S/D region (e.g. 135b1). Further, positions of the conductive structures can vary and be tailored to meet specific design requirements.

In the examples of FIGS. 1A and 1B, the shell structures 130a and 130b include a same semiconductor material. Accordingly, the respective gate structures 140a, 140b1, 140b2, 150a, 150b1 and 150b2 can include a same gate stack. In one embodiment, a plurality of PMOS is formed using the shell structures 130a and 130b and the respective gate structures 140a, 140b1, 140b2, 150a, 150b1 and 150b2. In another embodiment, a plurality of NMOS is formed using the shell structures 130a and 130b and the respective gate structures 140a, 140b1, 140b2, 150a, 150b1 and 150b2.

As will be discussed in detail later, in some examples, the shell structures may be chemically different, and the respective gate structures can include different gate stacks. In one example, the shell structures can include a same semiconductor material, but are doped differently. As a result, different electrical properties, such as threshold voltage, may be achieved. In another example, the shell structures may include more than one type of semiconductor material. For instance, the sub-shell structures 130*b*1 and 130*b*2 may include a p-type semiconductor material and an n-type semiconductor material respectively. Accordingly, PMOS and NMOS can be formed side by side. CMOS may therefore be implemented.

Additionally, in some embodiments, the first layer 110 is positioned over an insulator disposed on a substrate (not shown). That is, an epitaxial layer of the first semiconductor material is grown on a substrate having a dielectric layer disposed thereon, thus forming an SOI (silicon-on-insulator), a GeOI (Germanium-on-insulator), an SGOI (SiGe-on-insulator) or the like. In some embodiments, the first layer 110 can include completed devices with isolated silicon on top. In some embodiments, the first layer 110 includes single crystal silicon at a top surface of the first layer 110.

Techniques herein include a method to fabricate semiconductor devices, such as the semiconductor device 100 and the like. Accordingly to some aspects of the present disclosure, the method includes forming shell structures, such as the shell structures 130*a* and 130*b*. Each shell structure is configured to include a top S/D region, a channel region and a bottom S/D region serially connected in a vertical direction and have a current flow path in the vertical direction. The method also includes forming a bottom contact structure connected to a respective bottom S/D region of each shell structure and forming a gate structure on a sidewall of a respective channel region of each shell structure.

Figure 2A:
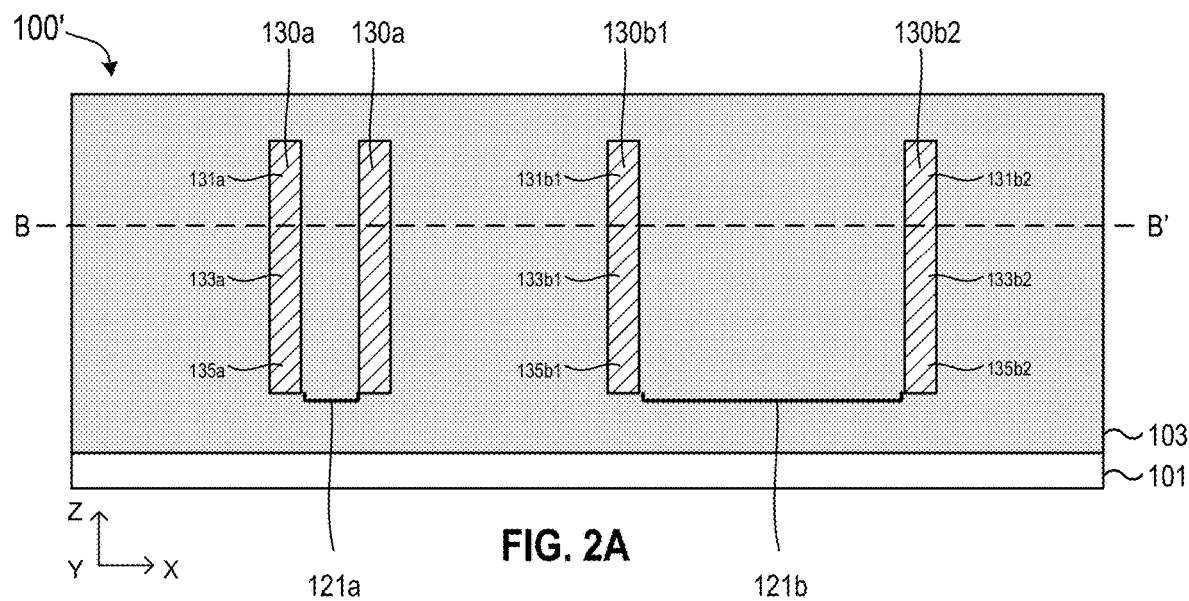
FIGS. 2A, 2B, 2C, 2D, 2E, 2F, 2G, 2H and 2I show vertical cross-sectional views of a semiconductor device at various intermediate steps of manufacturing, in accordance with one embodiment of the present disclosure.
Figure 2A:
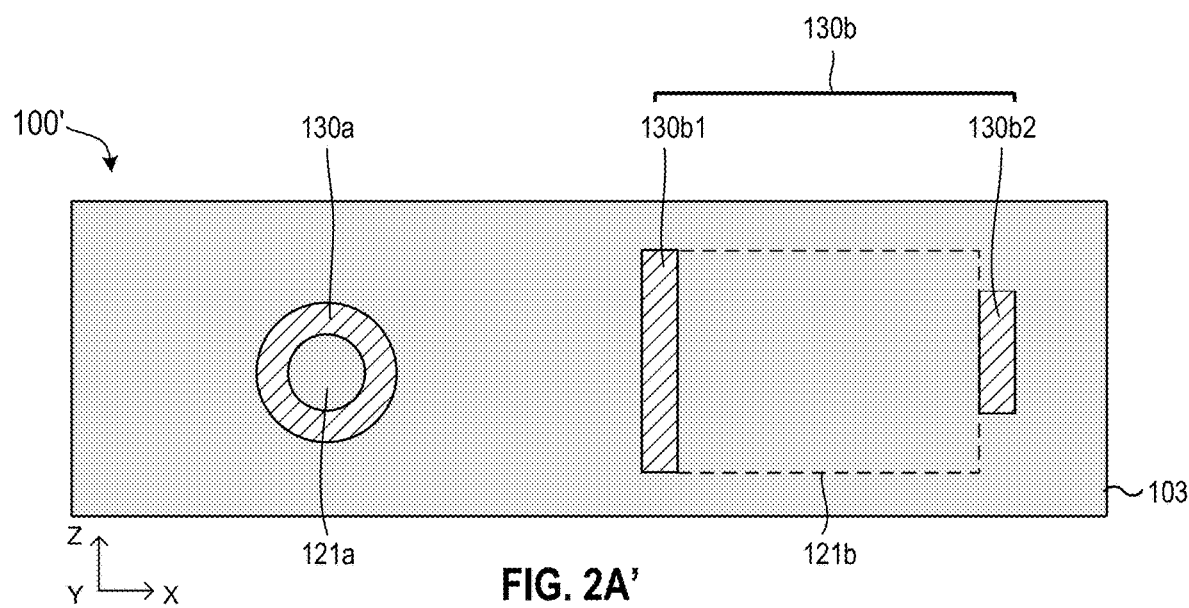

FIGS. 2A, 2B, 2C, 2D, 2E, 2F, 2G, 2H and 2I show vertical cross-sectional views of a semiconductor device 100' at various intermediate steps of manufacturing, in accordance with one embodiment of the present disclosure. FIG. 2A' shows a horizontal cross-sectional view taken along the line cut BB' in FIG. 2A, in accordance with one embodiment of the present disclosure. In some embodiments, the semiconductor device 100' can eventually become the semiconductor device 100 in FIGS. 1A and 1B.

As shown in FIGS. 2A and 2A', the semiconductor device 100' includes the first layer 101 and the shell structures 130*a* and 130*b* positioned above the first layer 101. The shell structures 130*a* and 130*b* have horizontal and vertical isolation, such as a dielectric layer. For example, the shell structures 130*a* and 130*b* are electrically isolated from the first layer 101 by the dielectric material 103. As mentioned earlier, each shell structure is configured to include a top S/D region (e.g. 131*a*, 131*b*1 and 131*b*2), a channel region (e.g. 133*a*, 133*b*1 and 133*b*2) and a bottom S/D region (e.g. 135*a*, 135*b*1 and 135*b*2) serially connected in the vertical direction perpendicular to the first layer 101 and have a current flow path in the vertical direction.

Further, the shell structures 130*a* and 130*b* include dielectric core structures 121*a* and 121*b* respectively. The dielectric core structures 121*a* and 121*b* can, for example, include the dielectric material 103. Top surfaces of the shell structures 130*a* and 130*b* may be covered by the dielectric material 103 as shown or exposed alternatively. In addition, dimensions and spacing of the sub-shell structures 130*b*1 and 130*b*2 may vary. Herein in this example, the sub-shell structure 130*b*1 is longer than the sub-shell structure 130*b*2 in the y direction in the xy plane.

In some embodiments, forming the shell structures 130*a* and 130*b* includes providing a substrate having the first layer 101 and forming a second layer of a second semiconductor material over the first layer 101, as disclosed in the aforementioned reference. The second layer is directionally etched using a mask to form independent core structures of the second semiconductor material on the first semiconductor material. Each independent core structure has a sidewall extending from an exposed surface of the first layer 101. A third layer of a dielectric material is formed on the exposed surface of the first layer to cover a lower portion of a respective sidewall of each core structure with the dielectric material. A shell structure is formed on an upper portion of a respective sidewall of each core structure to form the shell structures. The core structures are replaced with an insulating material to form the dielectric core structure (e.g. 121*a* and 121*b*) of each shell structure (e.g. 130*a* and 130*b*).

Figure 2B:
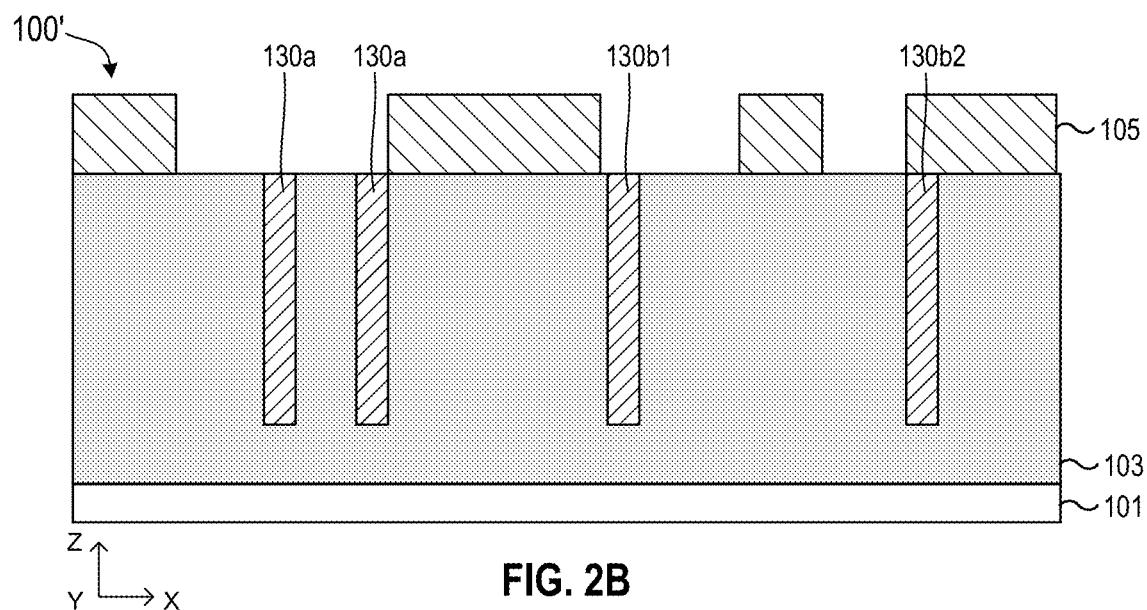
Figure 2C:
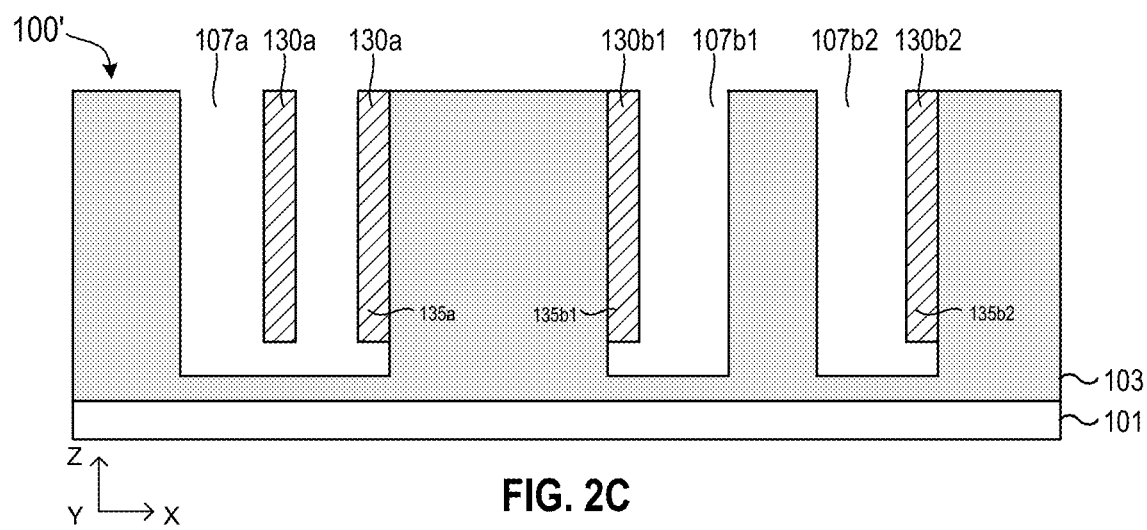
Figure 2D:
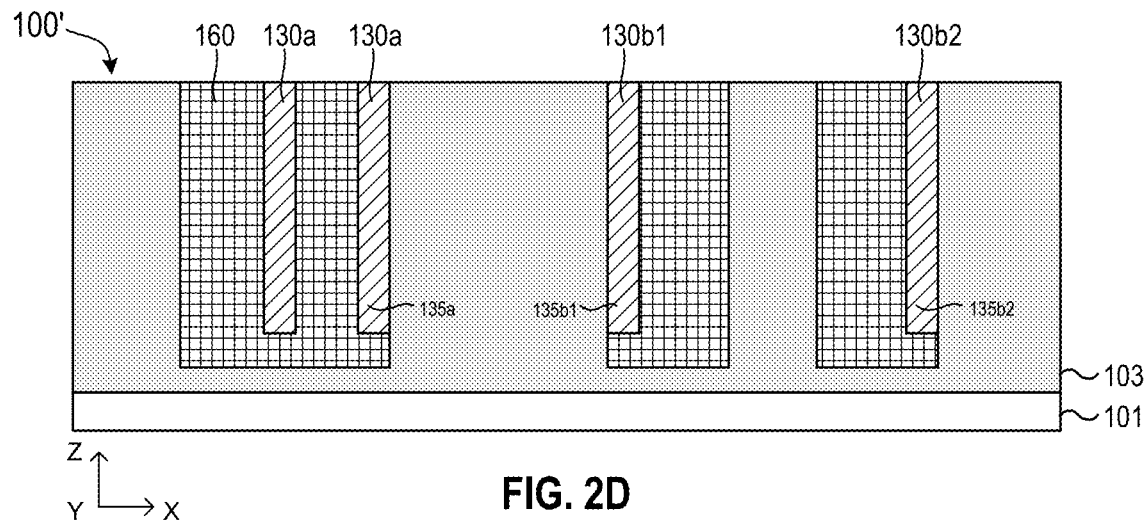

In FIG. 2B, a mask layer, such as a resist layer 105, is deposited and patterned. In FIG. 2C, the resist layer 105 is used as an etching mask to form an opening along a respective sidewall of each shell structure to expose a respective bottom S/D region of each shell structure. The resist layer 105 is then removed. For example, openings 107*a*, 107*b*1 and 107*b*2 are formed to expose the bottom S/D regions 135*a*, 135*b*1 and 135*b*2 respectively. The openings 107*a*, 107*b*1 and 107*b*2 may be formed by etching a distance beyond the shell structures 130*a* and 130*b* in the z direction. Note that a shell structure (e.g. 130*a*) can have a respective opening (e.g. 107*a*) extending from an inner (core) portion of the shell structure (e.g. 130*a*) to an outer portion, while another shell structure (e.g. 130*b*) may have an opening (e.g. 107*b*1) only in an inner portion or an opening (not shown) only in an outer portion.

Figure 2E:
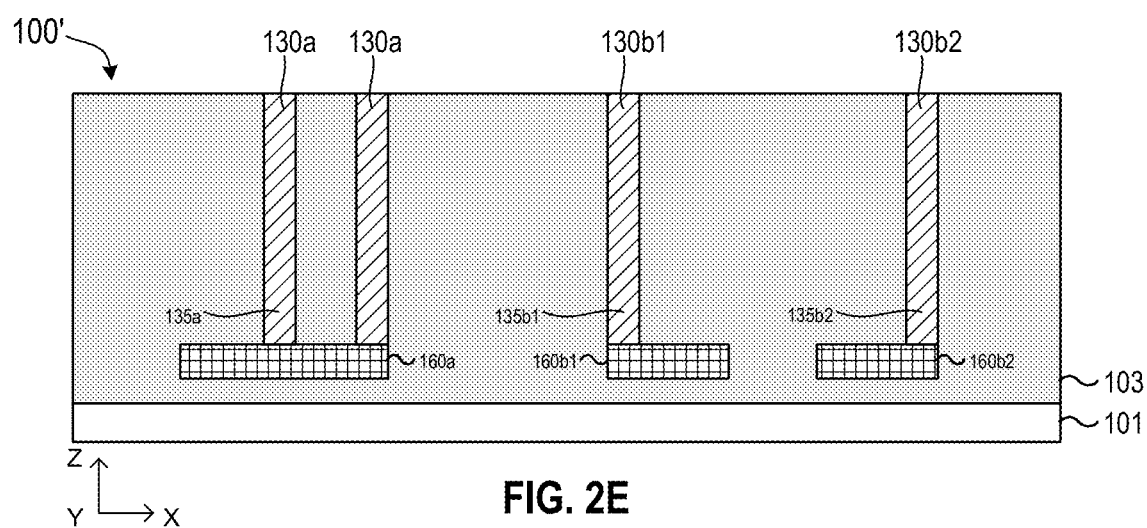

Next in FIG. 2C, the openings can be filled with a conductive material 160, such as tungsten. This can be an overfill which is then planarized by chemical-mechanical polishing (CMP). As a result, bottom portions of the conductive material 160 are in contact with the bottom S/D regions 135*a*, 135*b*1 and 135*b*2. In FIG. 2E, the conductive material 160 is etched back to remove top portions of the conductive material 160 so that the bottom portions of the conductive material 160 forms the bottom contact structure 160*a*, 160*b*1 and 160*b*2. For example, a metal etch can be executed to recess the conductive material 160 below the shell structures 130*a* and 130*b* but in contact with the shell structures 130*a* and 130*b*. Subsequently, the dielectric material 103 may be optionally deposited to fill etched space (e.g. overfill and planarization).

Note that in the examples of FIGS. 2B-2E, the bottom contact structure 160*a*, 160*b*1 and 160*b*2, which are partially defined by the openings 107*a*, 170*b*1 and 170*b*2, are formed below the bottom S/D regions 135*a*, 135*b*1 and 135*b*2. In other examples, the openings 107*a*, 170*b*1 and 170*b*2 may only expose the bottom S/D regions 135*a*, 135*b*1 and 135*b*2 from side surfaces, and not from bottom surfaces. As a result, the bottom contact structures 160*a*, 160*b*1 and 160*b*2 may be positioned adjacent to and in contact with the bottom S/D regions 135*a*, 135*b*1 and 135*b*2 respectively.

Figure 2F:
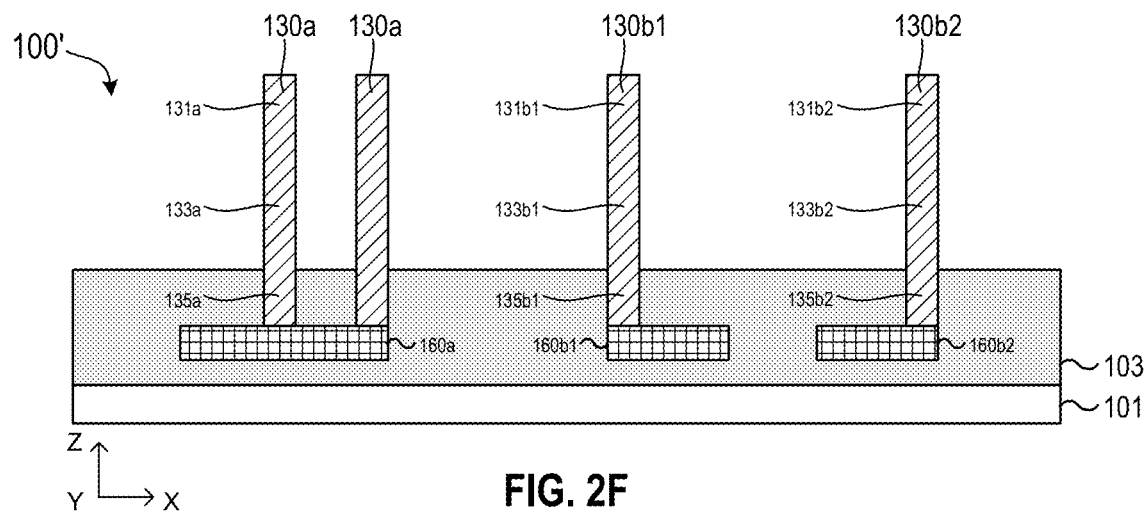

In FIG. 2F, the dielectric material 103 is recessed or etched back in order to expose the top S/D regions 131*a*, 131*b*1 and 131*b*2 and the channel regions 133*a*, 133*b*1 and 133*b*2. The bottom S/D regions 135*a*, 135*b*1 and 135*b*2 remain covered by the dielectric material 103. Note that in the example of FIG. 2F, the dielectric material 103 is removed from outer sidewalls and inner sidewalls of the shell structures 130*a* and 130*b* in order to expose the top S/D regions 131*a*, 131*b*1 and 131*b*2 and the channel regions 133*a*, 133*b*1 and 133*b*2 from both outside and inside. As a result, respective outer gate structures and respective inner gate structures can be formed in subsequent processing.

Figure 2G:
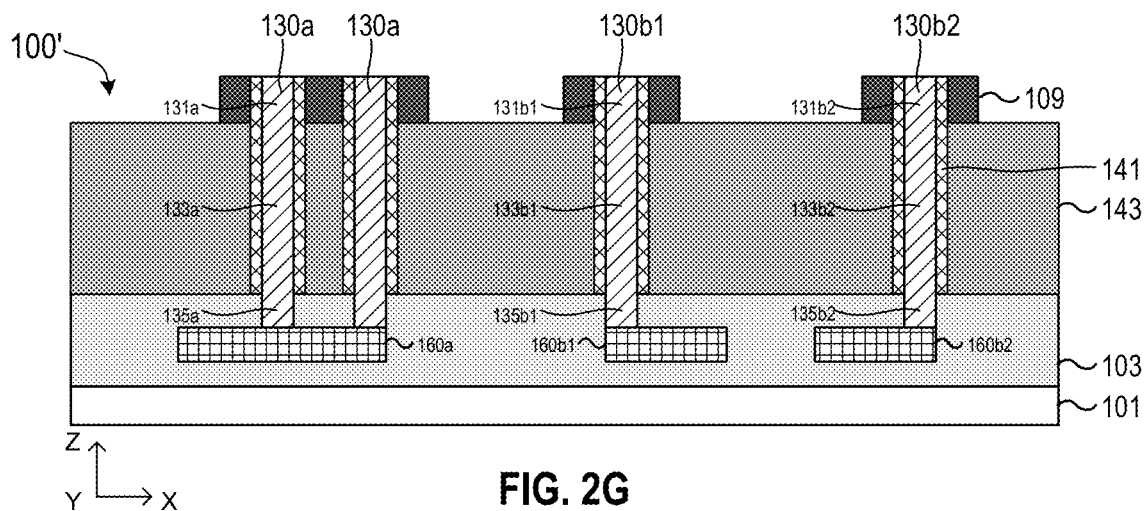

Subsequently, gate stacks are formed around the channel regions 133*a*, 133*b*1 and 133*b*2 and sidewall spacers are formed around the top S/D regions 131*a*, 131*b*1 and 131*b*2. In the example of FIG. 2G, firstly, at least one high-k dielectric 141 is formed on sidewalls of the channel regions 133*a*, 133*b*1 and 133*b*2 and the top S/D regions 131*a*, 131*b*1 and 131*b*2. For instance, a high-k material can be selectively deposited on uncovered (upper) portions of the shell structures 130*a* and 130*b*, being deposited on both interior (inner) and exterior (outer) surfaces of the shell structures 130*a* and 130*b*. Secondly, at least one WFM 143 is deposited around the channel regions 133*a*, 133*b*1 and 133*b*2. For instance, a WFM can be deposited over the dielectric material 103 to overfill spaces between the at least one high-k dielectric 141 before being recessed to be below top surfaces of the shell structures 130*a* and 130*b*. Note that inner and outer vertical cores can have a respective gate dielectric and a respective metal gate electrode shorted. Thirdly, sidewall spacers 109 are formed around the top S/D regions 131*a*, 131*b*1 and 131*b*2. For instance, a conformal deposition of spacer material can be executed over the at least one WFM 143, the at least one high-k dielectric 141 and the shell structures 130*a* and 130*b*. Then a directional etch can be executed to remove spacer material from horizontal surfaces, leaving spacer material on the (taller) vertical surfaces. The sidewall spacers 109 can define gate electrode thickness (in the xy plane).

Figure 2H:
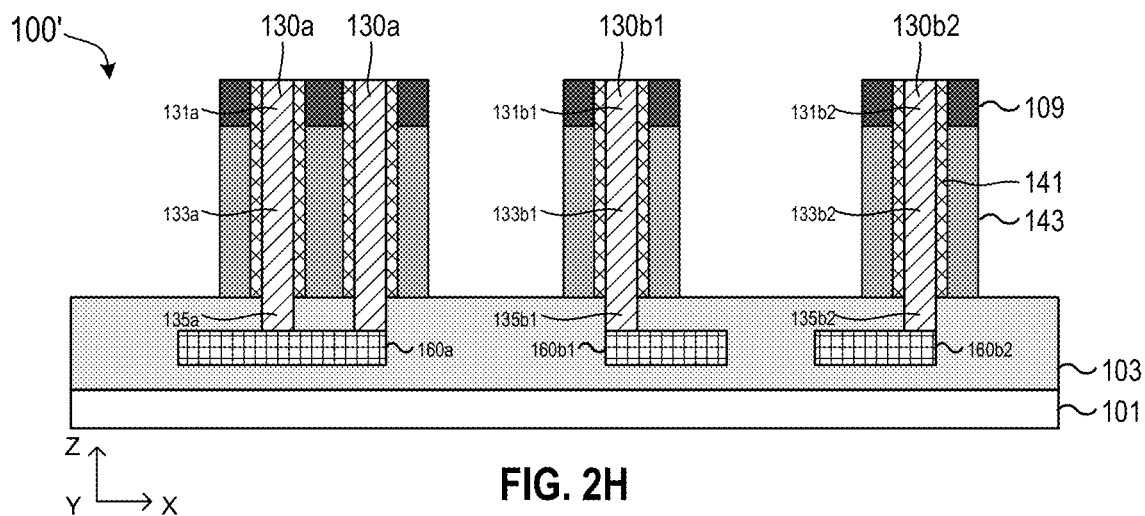
Figure 2I:
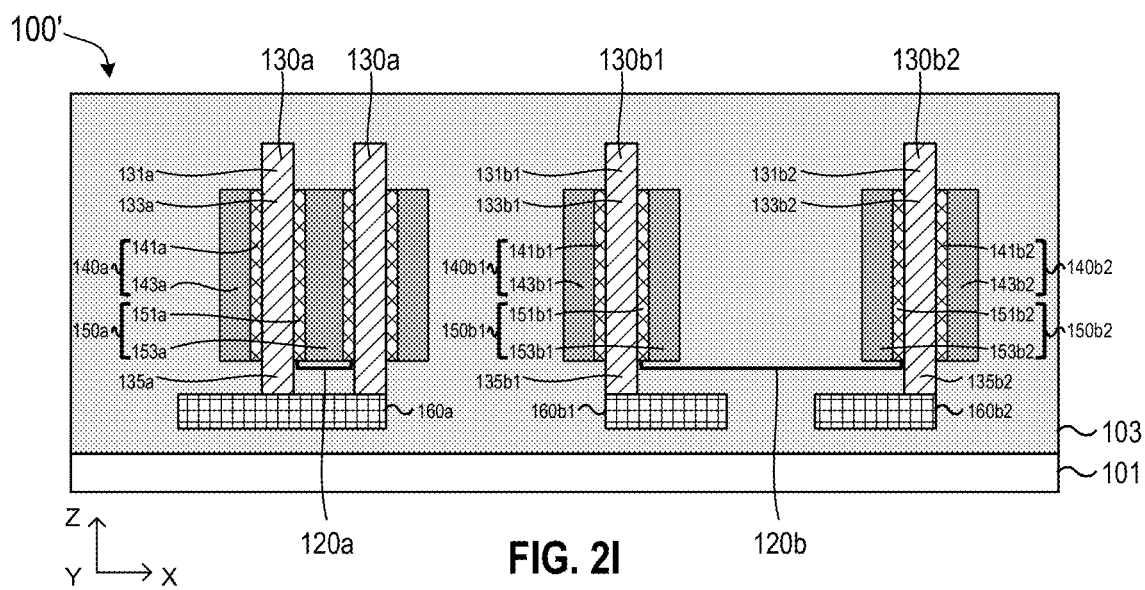

In FIG. 2H, excessive portions of the WFM 143 are etched using the sidewall spacers 109 as an etching mask. In FIG. 2I, the sidewall spacers 109 and uncovered (or excessive) portions of the high-k dielectric 141 are removed. Consequently, remaining portions of the high-k dielectric 141 and the WFM 143 form gate structures around the channel structures. Specifically, the outer gate structures 140*a*, 140*b*1 and 140*b*2 and the inner gate structures 150*a*, 150*b*1 and 150*b*2 are formed. The high-k dielectrics 141*a*, 141*b*1, 141*b*2, 151*a*, 151*b*1 and 151*b*2 correspond to the remaining portions of the high-k dielectric 141. The WFMs 143*a*, 143*b*1, 143*b*2, 153*a*, 153*b*1 and 153*b*2 correspond to the remaining portions of the WFM 143. Further, an insulating material, such as the dielectric material 103, can be deposited to cover the shell structures 130*a* and 130*b* and fill etched space. As a result, the inner structure 120*a* includes the inner gate structure 150*a* while the inner structure 120*b* includes the dielectric material 103 disposed between the inner gate structures 150*b*1 and 150*b*2. In some embodiments, while not shown, conductive structures can then be formed so that the semiconductor device 100' can become the semiconductor device 100 in FIGS. 1A and 1B.

Note that FIGS. 2G-2I show one example of forming the gate structures. In an alternative example, the at least one high-k dielectric 141 is selectively deposited on the uncovered (upper) portions of the shell structures 130*a* and 130*b*, and the at least one WFM 143 is deposited around the channel regions 133*a*, 133*b*1 and 133*b*2. Then, uncovered portions of the high-k dielectric 141 are removed from the top S/D regions 131*a*, 131*b*1 and 131*b*2 before the sidewall spacers 109 are formed. As a result, the sidewall spacers 109 are in direct contact with the top S/D regions 131*a*, 131*b*1 and 131*b*2. Then, the excessive portions of the WFM 143 are etched before the sidewall spacers 109 are removed.

In some embodiments, the sidewall spacers 109 may be formed with a different pattern so that the gate structures can have different configurations. In one example, the WFMs 153*b*1 and 153*b*2 are in contact (or merge with each other) to form a common inner gate structure for the channel regions 133*b*1 and 133*b*2. Accordingly, the inner structure 120*b* does not include the dielectric material 103. In another example, the WFM 153*a* may include an interior dielectric core, which is surrounded by the WFM 153*a*. The interior dielectric core can be made of the dielectric material 103.

As mentioned in FIGS. 1A and 1B, the shell structures may be chemically different from one another. The shell structures may include a same semiconductor material but are doped differently, or include more than one type of semiconductor material. As a result, various transistor devices may be formed using the shell structures. Particularly, FIG. 3 shows a vertical cross-sectional view of a semiconductor device 300, in accordance with another embodiment of the present disclosure.

Figure 3:
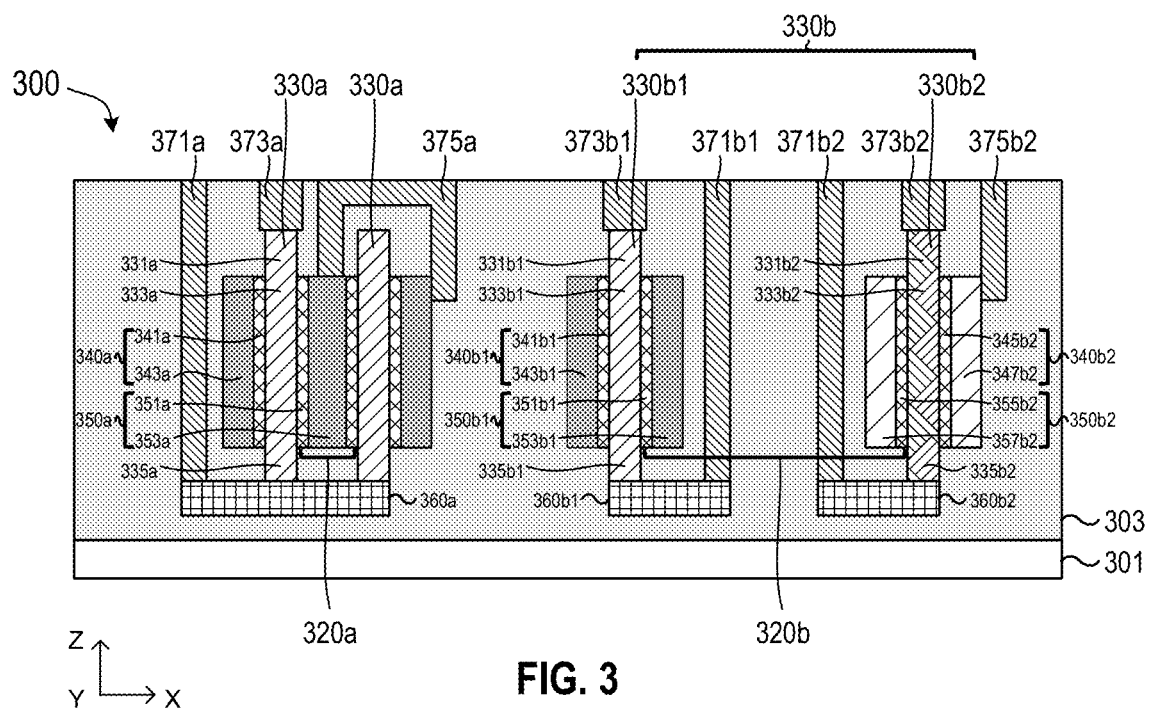
FIG. 3 shows a vertical cross-sectional view of a semiconductor device, in accordance with another embodiment of the present disclosure.

Embodiments of the semiconductor device 300 in FIG. 3 are similar to embodiments of the semiconductor device 100 in FIGS. 1A and 2B. For example, a first layer 301 corresponds to the first layer 101. A dielectric material 303 corresponds to the dielectric material 103. A continuous shell structure 330*a* corresponds to the continuous shell structure 130*a*. Outer gate structures 340*a* and 340*b*1 correspond to the outer gate structures 140*a* and 140*b*1 respectively. Inner gate structures 350*a* and 350*b*1 correspond to the inner gate structures 150*a* and 150*b*1 respectively. Bottom contact structures 360*a*, 360*b*1 and 360*b*2 correspond to the bottom contact structures 160*a*, 160*b*1 and 160*b*2 respectively. Conductive structures 371*a*, 373*a*, 375*a*, 371*b*1, 373*b*1, 371*b*2, 373*b*2 and 375*b*2 correspond to the conductive structures 171*a*, 173*a*, 175*a*, 171*b*1, 173*b*1, 171*b*2, 173*b*2 and 175*b*2 respectively. The descriptions have been provided above and will be omitted here for simplicity purposes.

While not shown, the semiconductor device 300 includes a conductive structure that corresponds to the conductive structure 175*b*1 in FIGS. 1A and 1B. However, the conductive structure is positioned differently from the conductive structure 175*b*1. In other words, the conductive structure is positioned in front of or behind the vertical cross section shown in FIG. 3. The conductive structure is in contact with the gate structure 340*b*1 or 350*b*1 and is configured to connect the gate structures 340*b*1 and 350*b*1 to at least one of an FSPDN or a BSPDN.

Different from the semiconductor device 100, the shell structures of the semiconductor device 300 include at least a first group and a second group. The first group of the shell structures and the second group of the shell structures include different semiconductor materials, or the first group of the shell structures and the second group of the shell structures include a same semiconductor material but are doped differently. As shown in FIG. 3, a discontinuous shell structure 330*b* includes sub-shell structures 330*b*1 and 330*b*2.

In a non-limiting example, the first group of the shell structures (e.g. 330*a* and 330*b*1) includes a first semiconductor material while the second group of the shell structures (e.g. 330*b*2) includes a second semiconductor material. Accordingly, an outer gate structure 340*b*2 may include a different gate stack from the outer gate structures 340*b*1 and 340*a*. That is, a high-k dielectric 345*b*2 may be chemically different from the high-k dielectrics 341*b*1 and 341*a*, and a WFM 347*b*2 may be chemically different from the WFMs 343*b*1 and 343*a*. Similarly, an inner gate structure 350*b*2 may include a different gate stack from the inner gate structures 350*b*1 and 350*a*. Therefore, the sub-shell structures 330*b*1 and 330*b*2 and gate structures 340*b*1, 350*b*1, 340*b*2 and 350*b*2 can be configured as a CMOS transistor.

In one embodiment, the sub-shell structures 330b1 and 330b2 include a p-type semiconductor material and an n-type semiconductor material respectively. In another embodiment, the sub-shell structures 330b1 and 330b2 include an n-type semiconductor material and a p-type semiconductor material respectively. In yet another embodiment, the sub-shell structures 330b1 and 330b2 both include an n-type semiconductor material but have different doping profiles.

In alternative embodiments, the first group of the shell structures includes the shell structure 330a while the second group of the shell structures includes the (sub-)shell structures 330b1 and 330b2.

FIGS. 4A, 4B, 4C, 4D, 4E and 4F show vertical cross-sectional views of a semiconductor device 300' at various intermediate steps of manufacturing, in accordance with another embodiment of the present disclosure. In some embodiments, the semiconductor device 300' can eventually become the semiconductor device 300 in FIG. 3.

Figure 4A:
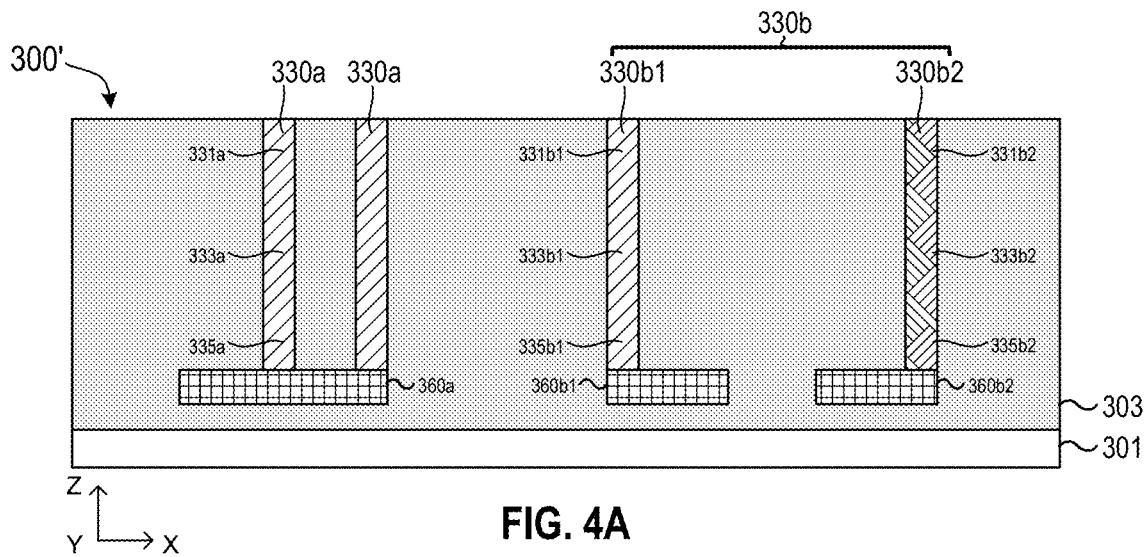
FIGS. 4A, 4B, 4C, 4D, 4E and 4F show vertical cross-sectional views of a semiconductor device at various intermediate steps of manufacturing, in accordance with another embodiment of the present disclosure.

As demonstrated in FIG. 4A, the semiconductor device 300' includes the first layer 301 and the shell structures 330a and 330b positioned above the first layer 301. The shell structures 330a and 330b are electrically isolated from the first layer 301 by the dielectric material 303 and electrically isolated from one another by the dielectric material 303. As mentioned earlier, each shell structure is configured to include a top S/D region (e.g. 331a, 331b1 and 331b2), a channel region (e.g. 333a, 333b1 and 333b2) and a bottom S/D region (e.g. 335a, 335b1 and 335b2) serially connected in the vertical direction perpendicular to the first layer 301 and have a current flow path in the vertical direction. The sub-shell structures 330b1 and 330b2 are chemically different from each other, e.g. having different semiconductor materials. Further, the semiconductor device 300' includes the bottom contact structures 360a, 360b1 and 360b2.

Note that FIG. 4A can correspond to FIG. 2E in some embodiments. That is, the semiconductor device 300 in FIG. 4A can be manufactured in similar steps, including forming the shell structures 330a, 330b1 and 330b2, forming openings using an etching mask to expose the bottom S/D region 335a, 335b1 and 335b2, forming the bottom contact structures 360a, 360b1 and 360b2, and depositing the dielectric material 301 to fill etched space.

Figure 4B:
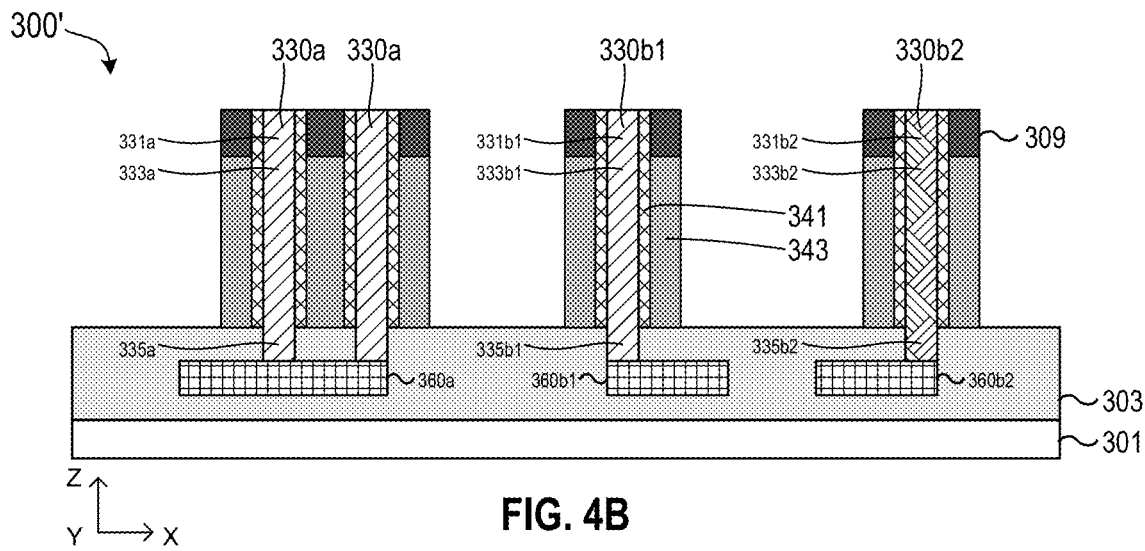

In FIG. 4B, gate stacks are formed around the channel regions 333a, 333b1 and 333b2, and sidewall spacers 309 are formed around the top S/D regions 331a, 331b1 and 331b2. The gate stacks include at least one high-k dielectric 341 and at least one WFM 343.

In some embodiments, FIG. 4B can correspond to FIG. 2H. That is, the semiconductor device 300 in FIG. 4B can go through similar steps, including exposing the top S/D regions 331a, 331b1 and 331b2 and the channel regions 333a, 333b1 and 333b2, forming the at least one high-k dielectric 341, depositing the at least one WFM 343 around the channel regions 333a, 333b1 and 333b2, forming the sidewall spacers 309, and removing excessive portions of the at least one WFM 343.

Figure 4C:
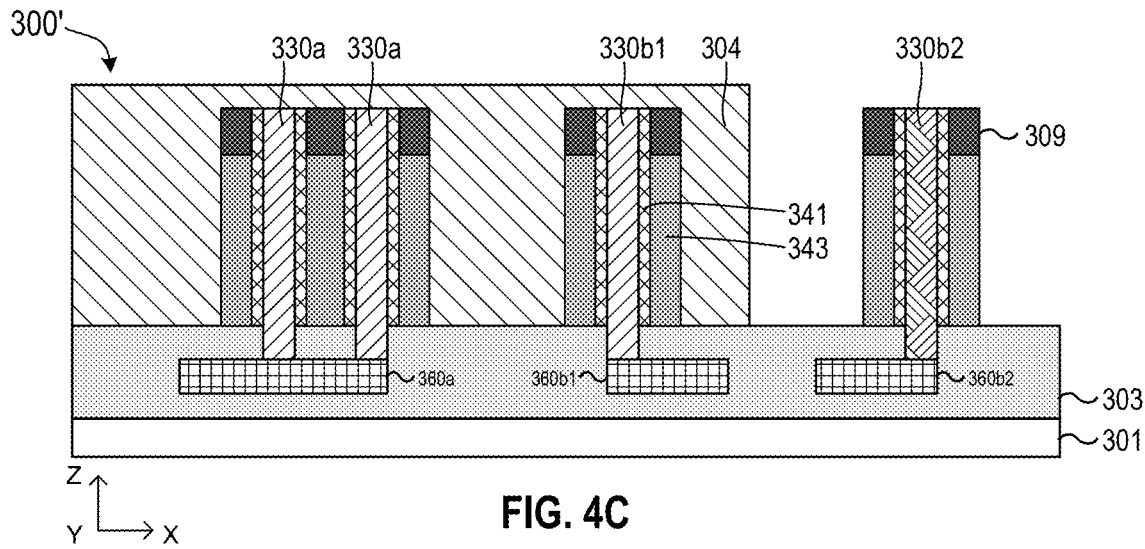
Figure 4D:
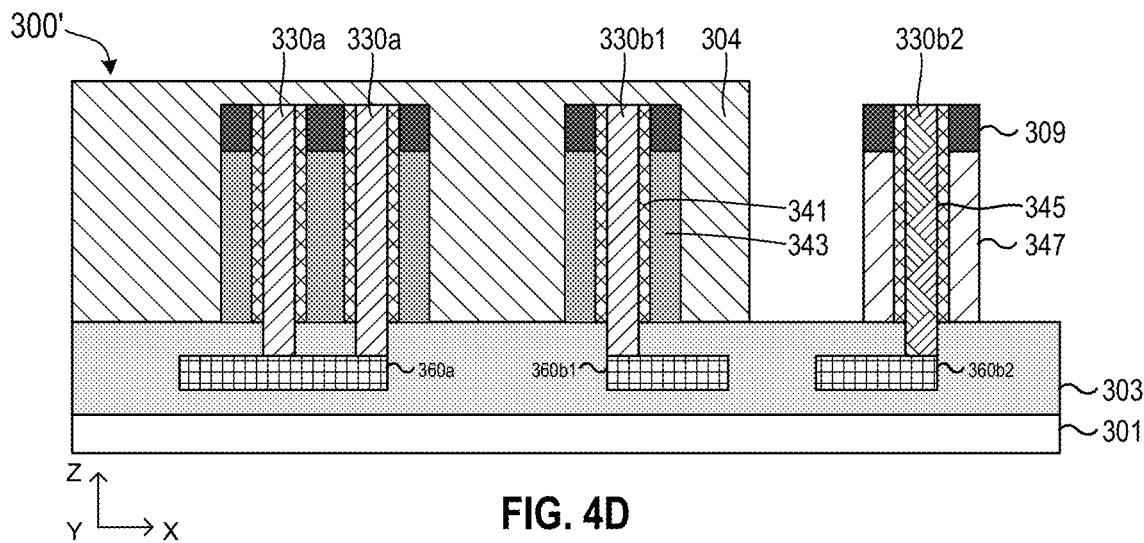

In FIG. 4C, a mask layer 304 is formed to cover the first group of the shell structures (e.g. 330a and 330b1) and respective gate stacks. In FIG. 4D, gate stacks around the second group of the shell structures are replaced. In some embodiments, exposed portions of the at least one high-k dielectric 341 and the at least one WFM 343 are replaced with at least one high-k dielectric 345 and at least one WFM 347. In some embodiments, the substrate is masked to open up NMOS regions to remove outer metal in the gate stack, suitable for NMOS devices. For example, a PMOS transistor may include an outer WFM and an inner WFM, and the outer WFM can be removed so that the inner WFM functions as a gate electrode for an NMOS transistor.

Figure 4E:
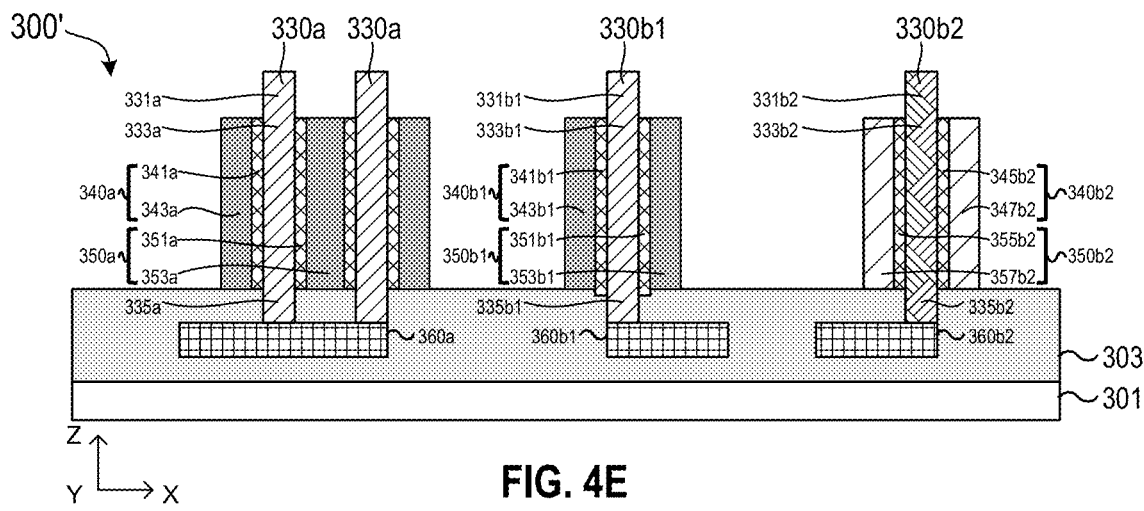

In FIG. 4E, the mask layer 304 is removed. The sidewall spacers 309 and uncovered (or excessive) portions of the at least one high-k dielectrics 341 and 345 are removed. Consequently, a first group of gate structures (e.g. 340a, 350a, 340b1 and 350b1) is formed on sidewalls of respective channel regions (e.g. 333a and 333b1) of the first group of shell structures (e.g. 330a and 330b1), and a second group of gate structures (e.g. 340b2 and 350b2) is formed on sidewalls of respective channel regions (e.g. 333b2) of the second group of shell structures (e.g. 330b2). For example, the first group of gate structures can be formed on the respective channel regions of the first group of the shell structures to create NMOS transistors. The second group of gate structures can be formed on the respective channel regions of the second group of the shell structures to create PMOS transistors. The first group of the shell structures has a different semiconductor material from the second group of the shell structures.

Note that FIGS. 4B-4E show one example of forming the first group of gate structures and the second group of gate structures. In another example, the first group of the shell structures and the second group of the shell structures are stepwise masked and uncovered to form the first group of gate structures and the second group of gate structures. For instance, the first group of the gate structures may be formed around the first group of shell structures while the second group of shell structures is masked. Subsequently, the second group of shell structures is uncovered, and the first group of the gate structures is masked. Next, the second group of gate structures is formed around the second group of shell structures.

Figure 4F:
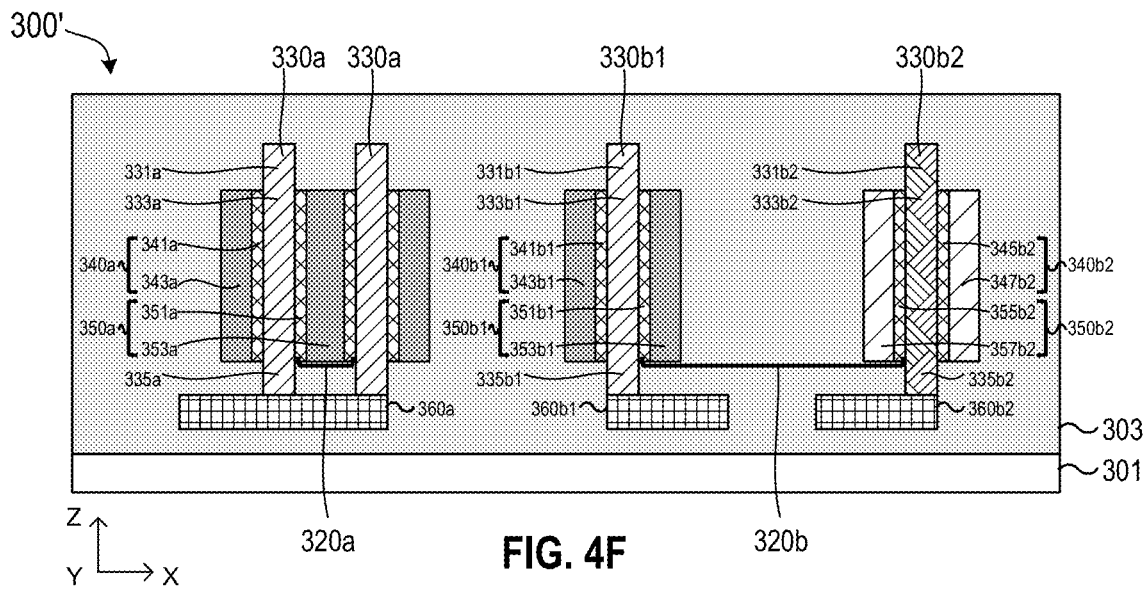

In FIG. 4F, an insulating material, such as the dielectric material 303 is deposited to cover the shell structures and respective gate structures. The dielectric material 303 can be planarized, and the semiconductor device 300' is now ready for wiring. In some embodiments, while not shown, conductive structures are then formed so that the semiconductor device 300' can become the semiconductor device 300 in FIG. 3.

Figure 5A:
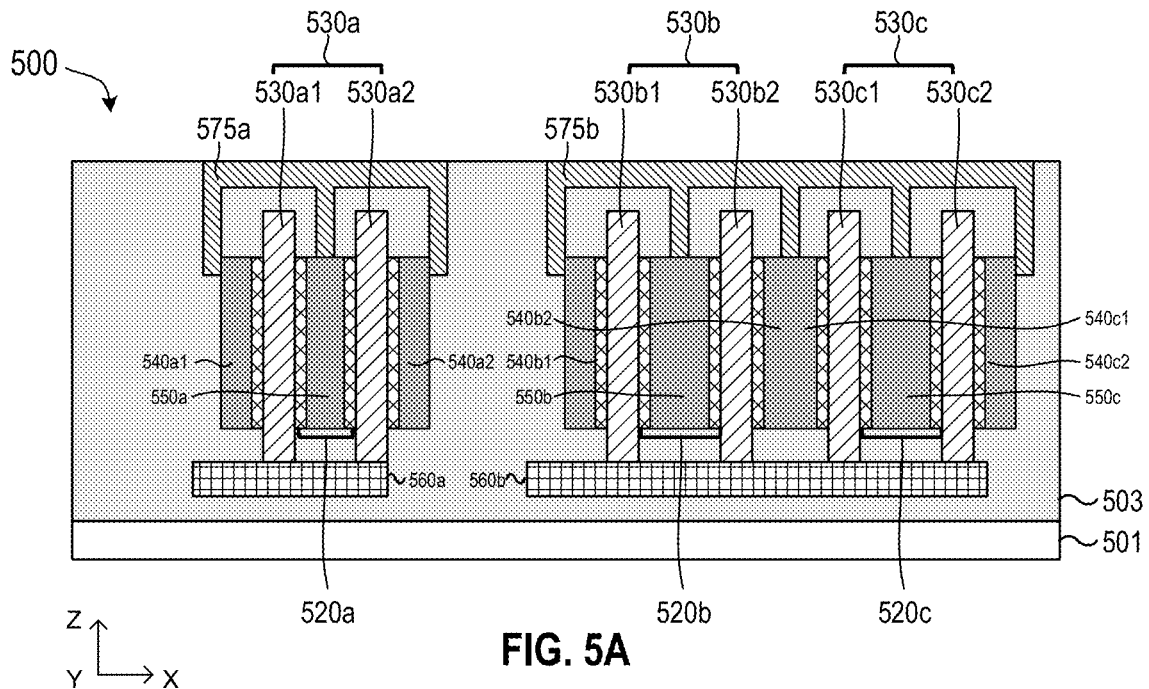
FIGS. 5A and 5B show vertical cross-sectional views of a semiconductor device, in accordance with yet another embodiment of the present disclosure.
Figure 5B:
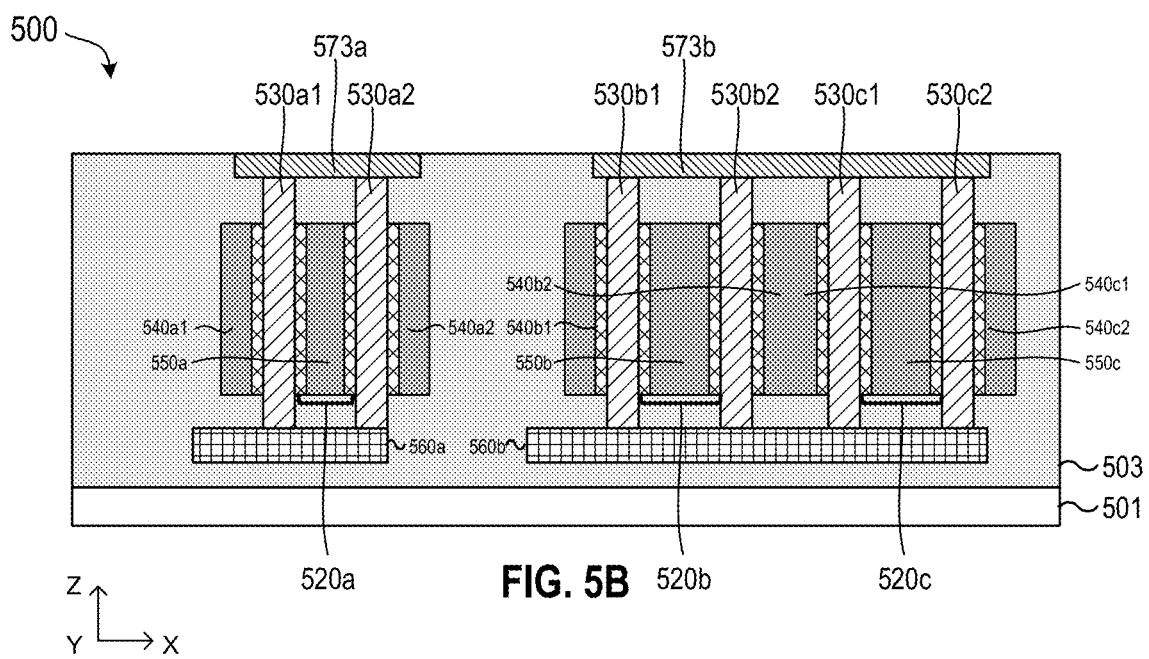

FIGS. 5A and 5B show vertical cross-sectional views of a semiconductor device 500, in accordance with yet another embodiment of the present disclosure. Embodiments of the semiconductor device 500 are similar to embodiments of the semiconductor device 100 in FIGS. 1A and 2B. For example, a first layer 501 corresponds to the first layer 101. A dielectric material 503 corresponds to the dielectric material 103.

As shown, the semiconductor device 500 includes discontinuous shell structures 530a, 530b and 530c corresponding to the (discontinuous) shell structure 130b. Each discontinuous shell structure (e.g. 530a) includes sub-shell structures (e.g. 530a1 and 530a2). An array of sub-shell structures (e.g. 530b1, 530b2, 530c1 and 530c2) can be positioned parallel and close to one another.

In some embodiments, an array of sub-shell structures includes the sub-shell structures 530a1 and 530a2. Outer gate structures 540a1 and 540a2 can be positioned around channel regions of the sub-shell structures 530a1 and 530a2. An inner structure 520a includes a common inner gate structure 550a for the channel regions of the sub-shell structures 530a1 and 530a2. That is, two neighboring inner gate structures can merge to form the common inner gate structure 550a. In one embodiment, the outer gate structures 540a1 and 540a2 and the common inner gate structure 550a are in contact and form GAA structures. In another embodiment, the outer gate structures 540a1 and 540a2 are spaced apart from the common inner gate structure 550a, but are electrically connected by a common conductive structure 575a.

In some embodiments, an array of sub-shell structures includes the sub-shell structures 530b1, 530b2, 530c1 and 530c2. Similarly, outer gate structures 540b1, 540b2, 540c1 and 540c2 can be positioned around channel regions of the sub-shell structures 530b1, 530b2, 530c1 and 530c2. However, neighboring outer gate structures (e.g. 540b2, 540c1) may merge to form common gate structures for neighboring channel regions. Neighboring inner gate structures may also merge to form common gate structures (e.g. 550b and 550c) for neighboring channel regions. In addition, it should be understood that an array of sub-shell structures can include any number of sub-shell structures.

Further, the semiconductor device 500 can include common conductive structures. Specifically, gate structures of an array of sub-shell structures can be electrically connected by one or more common conductive structures (e.g. 575a and 575b). Top S/D regions of the array of sub-shell structures can be electrically connected by one or more common conductive structures (e.g. 573a and 573b). Bottom S/D regions of the array of sub-shell structures can be electrically connected by common bottom contact structures (e.g. 560a and 560b) and one or more common conductive structures (not shown). The common conductive structures can be configured to connect respective top S/D regions, gate structures and bottom S/D regions to at least one of an FSPDN (not shown) or a BSPDN (not shown).

FIGS. 6A, 6B and 6C show vertical cross-sectional views of a semiconductor device 500' at various intermediate steps of manufacturing, in accordance with yet another embodiment of the present disclosure. In some embodiments, FIGS. 6A-6C show a method of making vertical 3D semiconductor shell nanosheets with shorted gate core regions with process showing vertical nanosheets with two, four and up to N cores that are shorted. In some embodiments, the semiconductor device 500' can eventually become the semiconductor device 500 in FIGS. 5A and 5B.

As shown in FIG. 6A, the semiconductor device 500' includes the first layer 501 and the shell structures 530a, 530b and 530c positioned above the first layer 501. The shell structures 530a, 530b and 530c have horizontal and vertical isolation, such as a dielectric layer. For example, the shell structures 530a, 530b and 530c are electrically isolated from the first layer 501 by the dielectric material 503. As mentioned earlier, each shell structure is configured to include a top S/D region (e.g. 531a1 and 531b1), a channel region (e.g. 533a1 and 533b1) and a bottom S/D region (e.g. 535a1 and 735b1) serially connected in the vertical direction perpendicular to the first layer 501 and have a current flow path in the vertical direction.

Further, the shell structures 530a, 530b and 530c include dielectric core structures 521a, 521b and 521c respectively. The dielectric core structures 521a, 521b and 521c can, for example, include the dielectric material 503. Top surfaces of the shell structures 530a, 530b and 530c may be exposed as shown or covered by the dielectric material 503 alternatively. In addition, dimensions and spacing of sub-shell structures 530a1, 530a2, 530b1, 530b2, 530c1 and 530c2 may vary. Herein in this example, the sub-shell structures 530b1, 530b2, 530c1 and 530c2 are positioned to form an array of sub-shell structures.

In FIG. 6B, the common bottom contact structures 560a and 560b are formed. The common bottom contact structure 560a is configured to connect bottom S/D regions of the sub-shell structures 530a1 and 530a2. The common bottom contact structure 560b is configured to connect bottom S/D regions of the sub-shell structures 530b1, 530b2, 530c1 and 530c2. The common bottom contact structures 560a and 560b can be formed by processes similar to FIGS. 2B-2E, except that respective openings may merge to form common openings.

Further, gate stacks are formed around the channel regions of the shell structures 530a, 530b and 530c, and sidewall spacers 509 are formed around the top S/D regions of the shell structures 530a, 530b and 530c. The gate stacks include at least one high-k dielectric 541 and at least one WFM 543. The gate stacks and the sidewall spacers 509 can be formed by processes similar to FIGS. 2F-2H, including exposing the top S/D regions and the channel regions of the shell structures 530a, 530b and 530c, forming at least one high-k dielectric 541, forming the at least one WFM 543 around the channel regions, forming the sidewall spacers 509, and removing excessive portions of the at least one WFM 343. Note that the at least one WFM 543 on neighboring channel regions can merge and need not be etched or divided.

In FIG. 6C, the sidewall spacers 509 and uncovered (or excessive) portions of the at least one high-k dielectrics 541 are removed. As a result, gate structures (including common gate structures), such as 540a1, 540a2, 540b1, 540b2, 540c1, 540c2, 550a, 550b and 550c, are formed. An insulating material, such as the dielectric material 503, can be deposited to cover the shell structures and the gate structures. The dielectric material 503 can be planarized by CMP. In some embodiments, while not shown, conductive structures are then formed so that the semiconductor device 500' can become the semiconductor device 500 in FIGS. 5A and 5B.

Figure 7A:
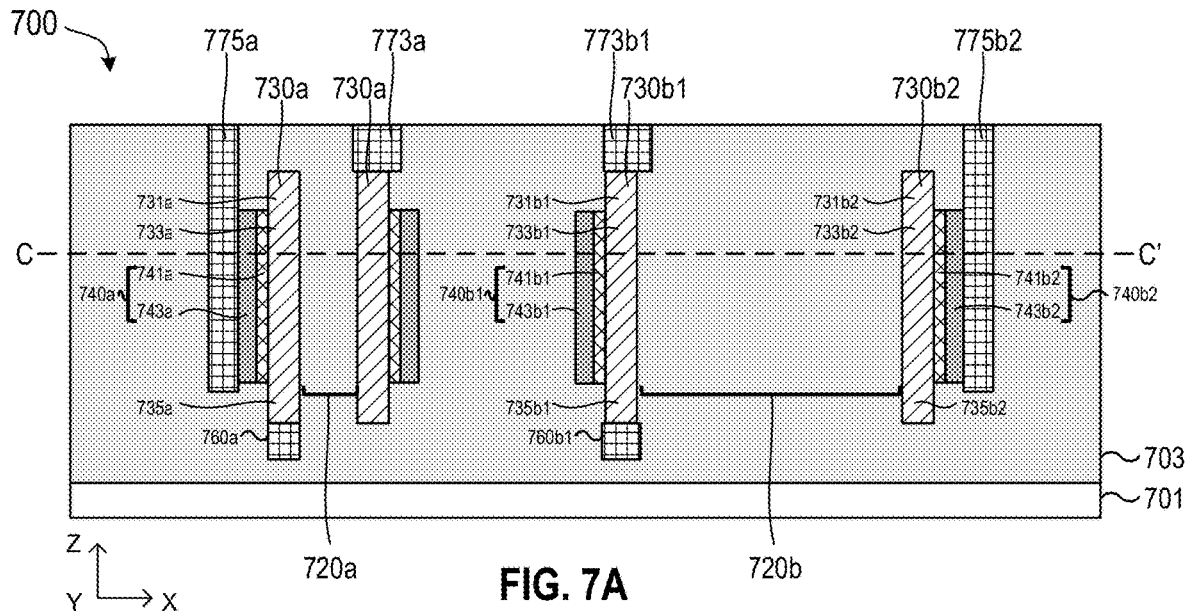
FIG. 7A shows a vertical cross-sectional view of a semiconductor device, in accordance with yet another embodiment of the present disclosure.
Figure 7B:
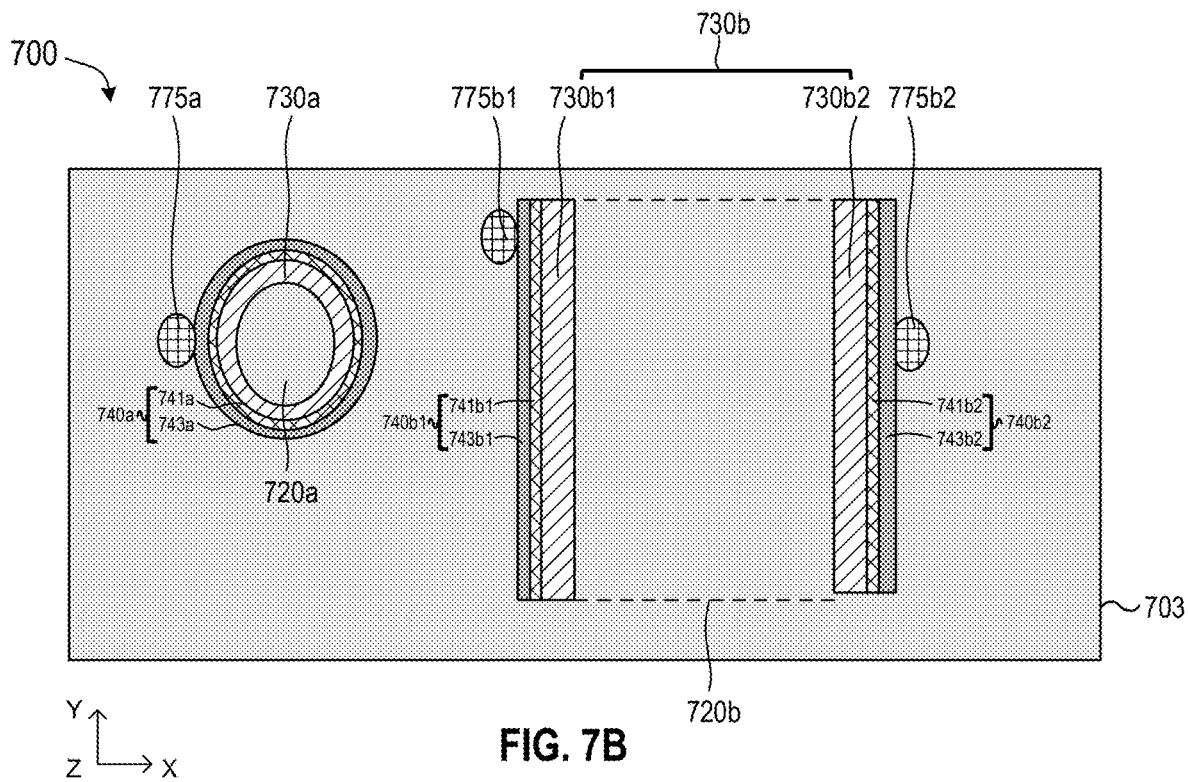
FIG. 7B shows a horizontal cross-sectional view taken along the line cut CC' in FIG. 7A, in accordance with yet another embodiment of the present disclosure.

FIG. 7A shows a vertical cross-sectional view of a semiconductor device 700, in accordance with yet another embodiment of the present disclosure. FIG. 7B shows a horizontal cross-sectional view taken along the line cut CC' in FIG. 7A, in accordance with yet another embodiment of the present disclosure.

Embodiments of the semiconductor device 700 in FIGS. 7A and 7B are similar to embodiments of the semiconductor device 100 in FIGS. 1A and 2B. For example, a first layer 701 corresponds to the first layer 101. A dielectric material 703 corresponds to the dielectric material 103. Shell structures 730a and 730b correspond to the shell structures 130a and 130b respectively. Outer gate structures 740a, 740b1 and 740b2 correspond to the outer gate structures 140a, 140b1 and 140b2 respectively. Bottom contact structures 760a and 760b1 correspond to the bottom contact structures 160a and 160b1 respectively. Conductive structures 773a, 775a, 773b1 and 775b2 correspond to the conductive structures 173a, 175a, 173b1 and 175b2 respectively. The descriptions have been provided above and will be omitted here for simplicity purposes.

While not shown, the semiconductor device 700 includes a bottom contact structure that corresponds to but is positioned differently from the bottom contact structure 160b2. The semiconductor device 700 also includes conductive structures that correspond to but are positioned differently from the conductive structures 171a, 171b1, 175b1, 171b2 and 173b2. For example, a conductive structure 775b1 is not shown in FIG. 7A, but shown in FIG. 7B because the conductive structure 775b1 is positioned in a different vertical cross section, or rather has a different position in the y direction in the xy plane.

Different from the semiconductor device 100, the semiconductor device 700 includes at least one inner structure (e.g. 720a and 720b) which includes a dielectric isolation and does not include an inner gate structure. In one embodiment, the inner structure 720a includes a dielectric core made of the dielectric material 703. The shell structure 730a and the outer gate structures 740a can be configured to be a GAA device. In another embodiment, the inner structure 720b includes the dielectric material 703 between sub-shell structure 730b1 and 730b2 of the (discontinuous) shell structure 730b. Each sub-shell structure (e.g. 730b1) and a respective outer gate structure (e.g. 740b1) can be configured to be a transistor device.

Figure 8A:
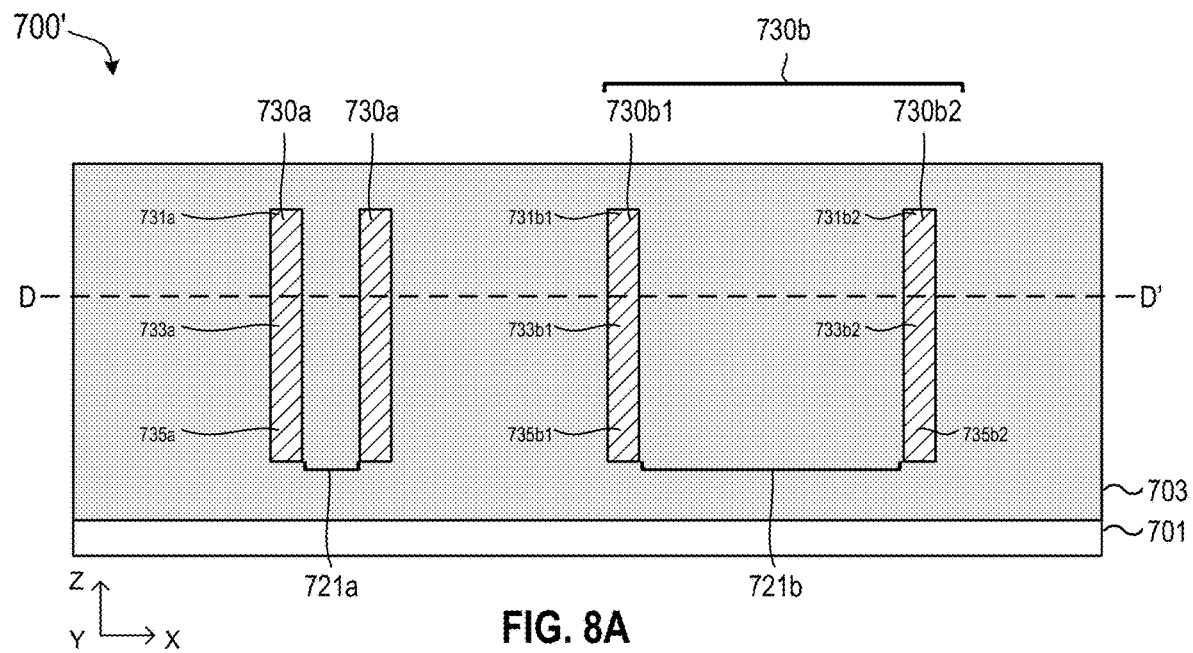
FIGS. 8A, 8B, 8C, 8D, 8E, 8F and 8G show vertical cross-sectional views of a semiconductor device at various intermediate steps of manufacturing, in accordance with yet another embodiment of the present disclosure.
Figure 8A:
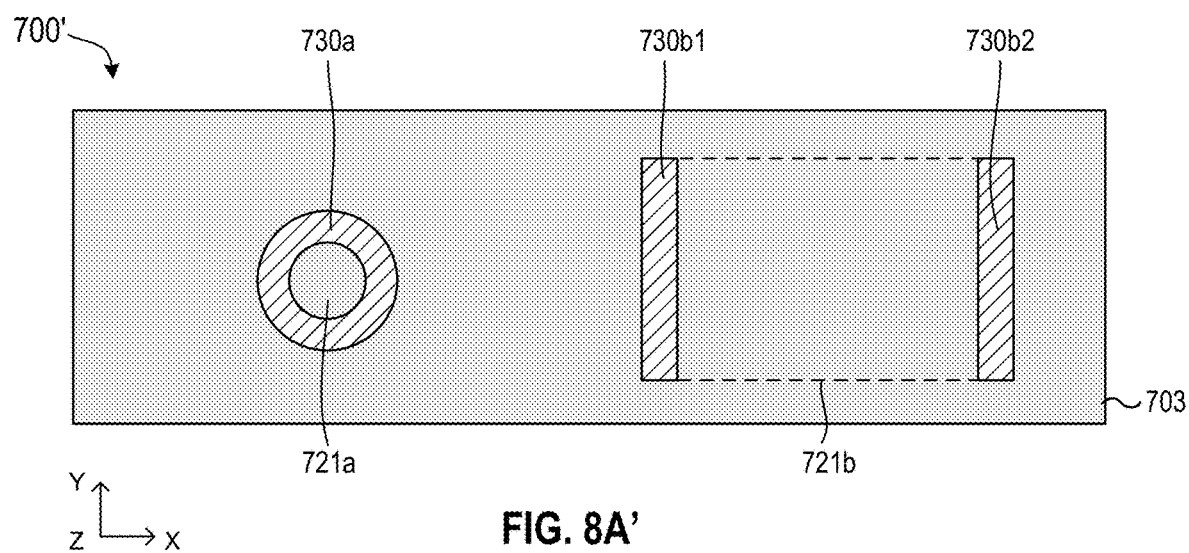

FIGS. 8A, 8B, 8C, 8D, 8E, 8F and 8G show vertical cross-sectional views of a semiconductor device 700' at various intermediate steps of manufacturing, in accordance with yet another embodiment of the present disclosure. FIG. 8A' shows a horizontal cross-sectional view taken along the line cut DD' in FIG. 8A, in accordance with yet another embodiment of the present disclosure. In one example, FIGS. 8A-8G shows a flow including vertical 3D semiconductor nano-transistors with integrated 3D dielectric core using vertical nano sheets for PMOS devices with 3D diffusion breaks. In one example, FIGS. 8A-8G shows another flow including vertical 3D semiconductor nano-transistors with integrated 3D dielectric core using vertical nano sheets for NMOS devices with 3D diffusion breaks.

In some embodiments, the semiconductor device 700' can eventually become the semiconductor device 700 in FIGS. 7A and 7B. As shown in FIGS. 8A and 8A', the semiconductor device 700' includes the first layer 701 and the shell structures 730a and 730b positioned above the first layer 701. The shell structures 730a and 730b have horizontal and vertical isolation, such as a dielectric layer. For example, the shell structures 730a and 730b are electrically isolated from the first layer 701 by the dielectric material 703. As mentioned earlier, each shell structure is configured to include a top S/D region (e.g. 731a, 731b1 and 731b2), a channel region (e.g. 733a, 733b1 and 733b2) and a bottom S/D region (e.g. 735a, 735b1 and 735b2) serially connected in the vertical direction perpendicular to the first layer 701 and have a current flow path in the vertical direction. While not shown, bottom contact structures (e.g. 760a and 760b1 in FIGS. 7A and 7B) that are configured to connect to the bottom S/D regions can be formed.

Further, the shell structures 730a and 730b include dielectric core structures 721a and 721b respectively. The dielectric core structures 721a and 721b can, for example, include the dielectric material 703. Top surfaces of the shell structures 730a and 730b may be covered by the dielectric material 703 as shown or exposed alternatively. In addition, dimensions and spacing of sub-shell structures 730b1 and 730b2 may vary. Herein in this example, the sub-shell structure 730b1 is as long as the sub-shell structure 730b2 in the y direction in the xy plane.

Figure 8B:
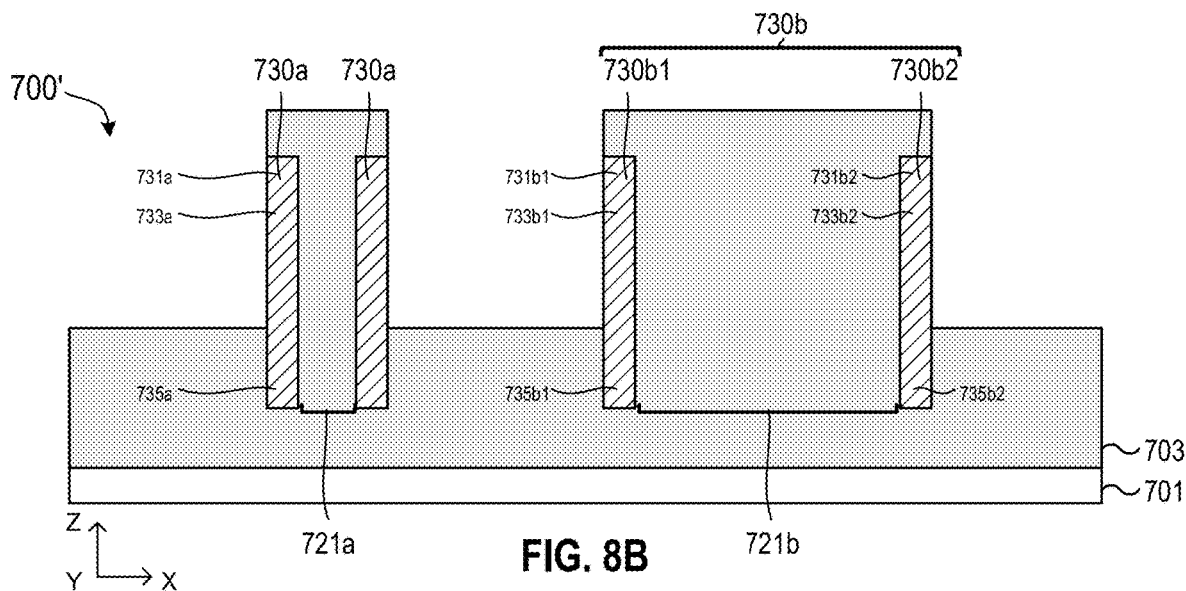

In FIG. 8B, a portion of the dielectric material 703 positioned on outer sidewalls of the shell structures 730a and 730b is removed in order to expose the top S/D regions 731a, 731b1 and 731b2 and the channel regions 733a, 733b1 and 733b2 from outside. The bottom S/D regions 735a, 735b1 and 735b2 remain covered by the dielectric material. Moreover, the dielectric core structures 721a and 721b are not removed.

Figure 8C:
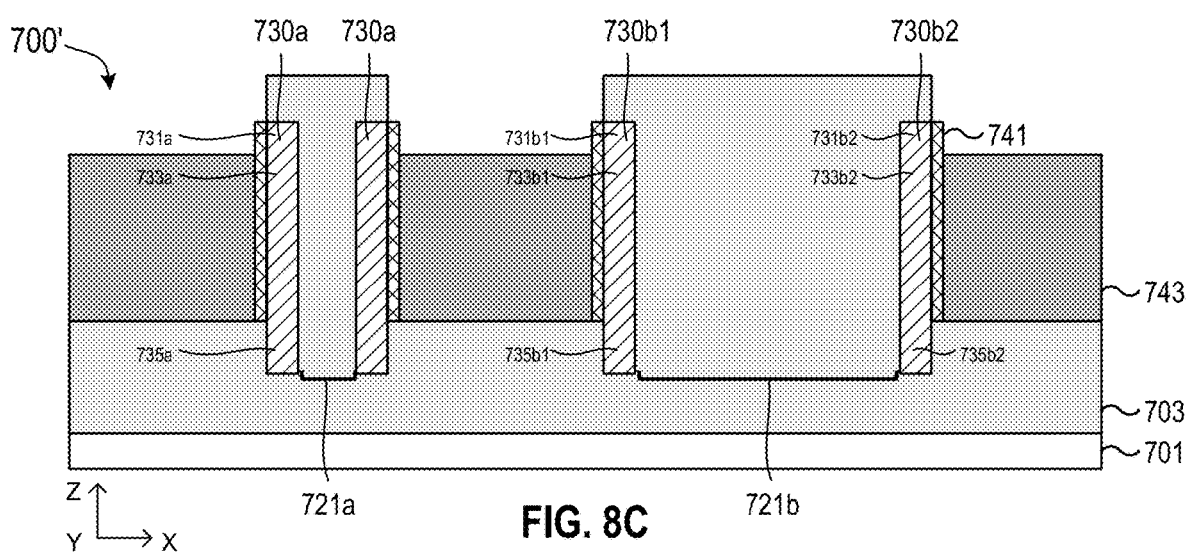

Subsequently, gate stacks are formed around the channel regions 733a, 733b1 and 733b2 and sidewall spacers are formed around the top S/D regions 731a, 731b1 and 731b2. In the example of FIG. 8C, at least one high-k dielectric 741 is formed on the channel regions 733a, 733b1 and 733b2 and the top S/D regions 731a, 731b1 and 731b2. At least one WFM 743 is deposited on the channel regions 733a, 733b1 and 733b2, for example by deposition, planarization and etching back to recess below top surfaces of the shell structures 730a and 730b.

Figure 8D:
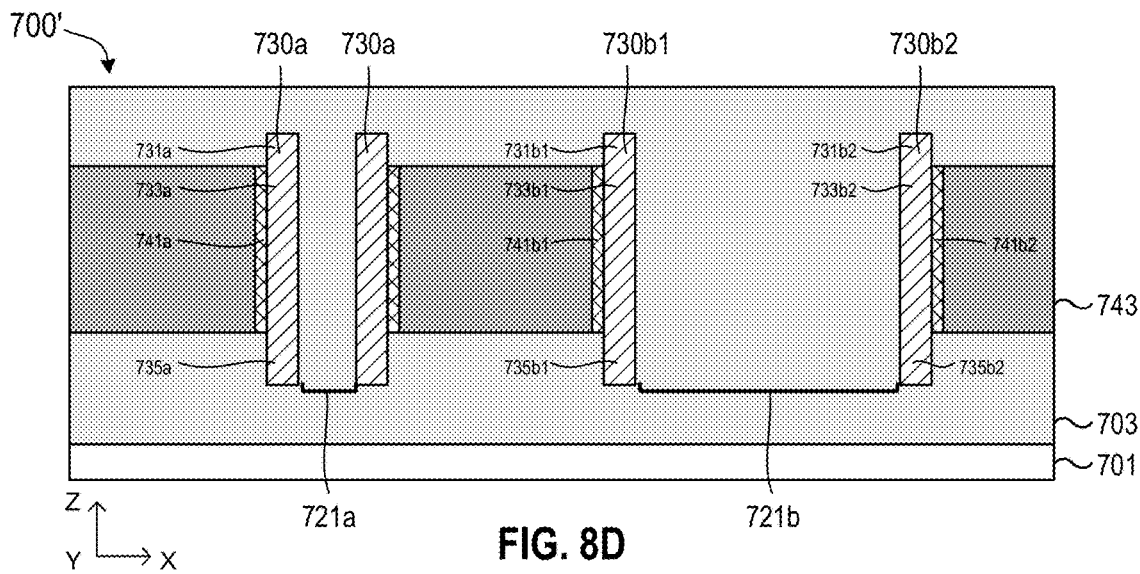
Figure 8E:
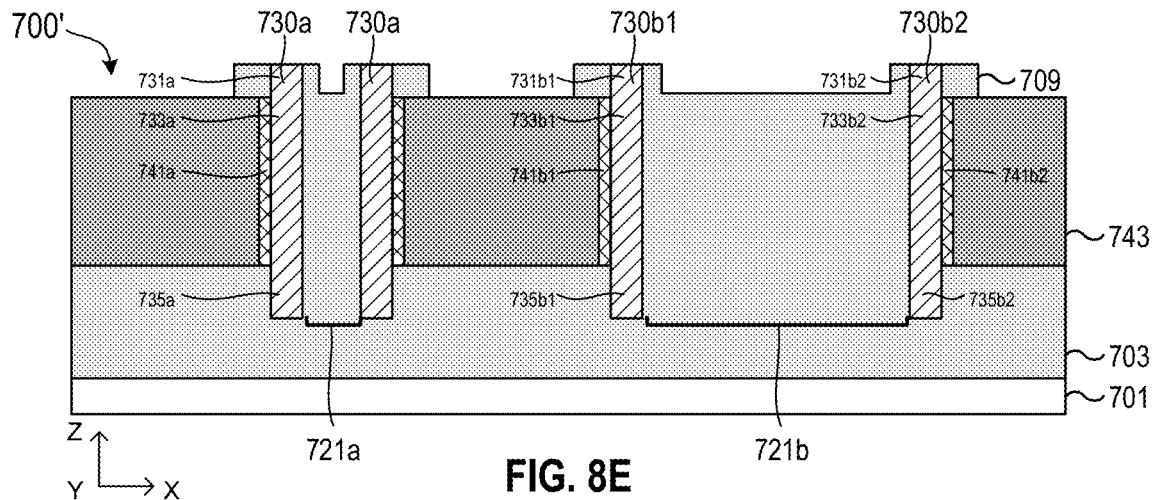
Figure 8F:
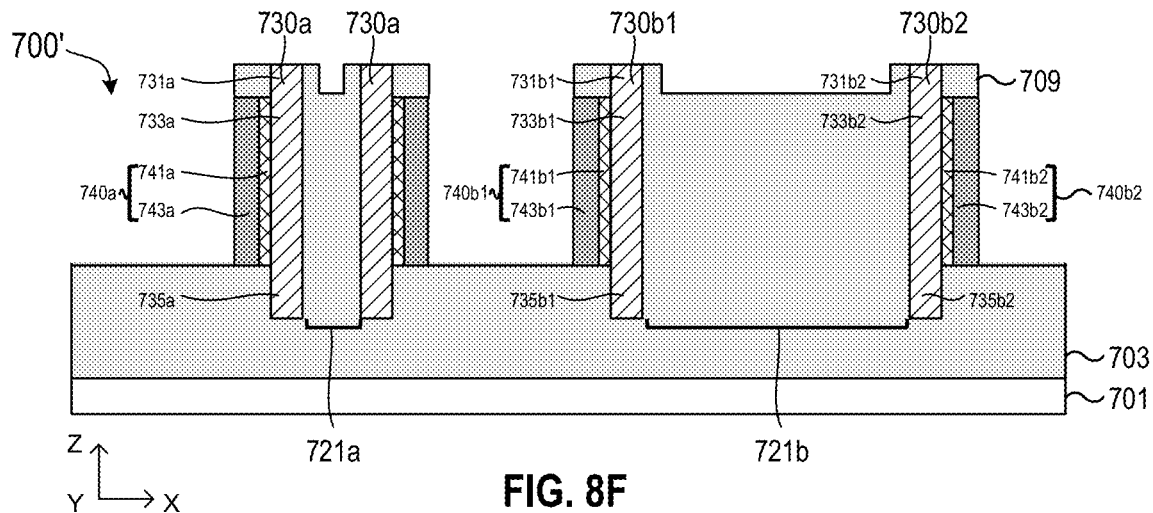

In FIG. 8D, uncovered (or excessive) portions of the at least one high-k dielectrics 741 are removed. Then an insulating material, such as the dielectric material 703 is deposited and planarized. In FIG. 8E, the dielectric material 703 is etched back to leave sidewall spacers 709 on uncovered portions of the shell structures 730a and 730b, that is, the top S/D regions 731a, 731b1 and 731b2. In FIG. 8F, excessive portions of the at least one WFM 743 are removed by directionally etching the at least one WFM 743 using the sidewall spacers 709 as an etching mask. The result is a relatively thin metal gate remaining on the high-k material to complete the electrode region of the vertical transistors. That is, the outer gate structures 740, 740b1 and 740b2 are formed on outer sidewalls of the channel regions 733a, 733b1 and 733b2.

Figure 8G:
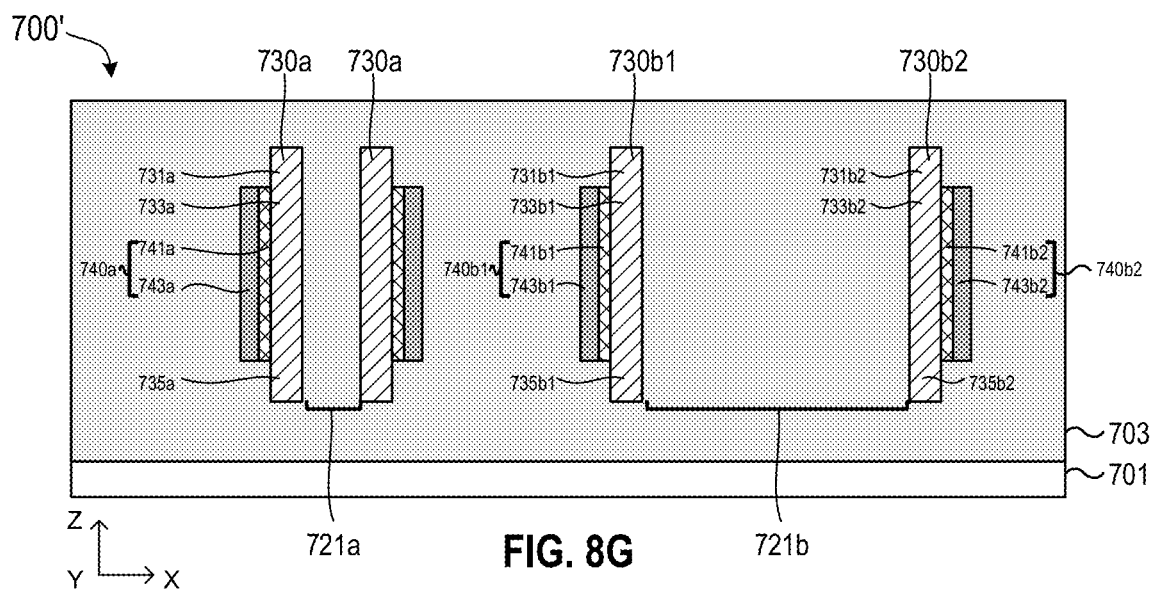

In FIG. 8G, an insulating material, such as the dielectric material 703, is deposited to cover the shell structures and the gate structures. The dielectric material 703 can be planarized by CMP. In some embodiments, while not shown, conductive structures are then formed so that the semiconductor device 700' can become the semiconductor device 700 in FIGS. 7A and 7B.

Figure 9:
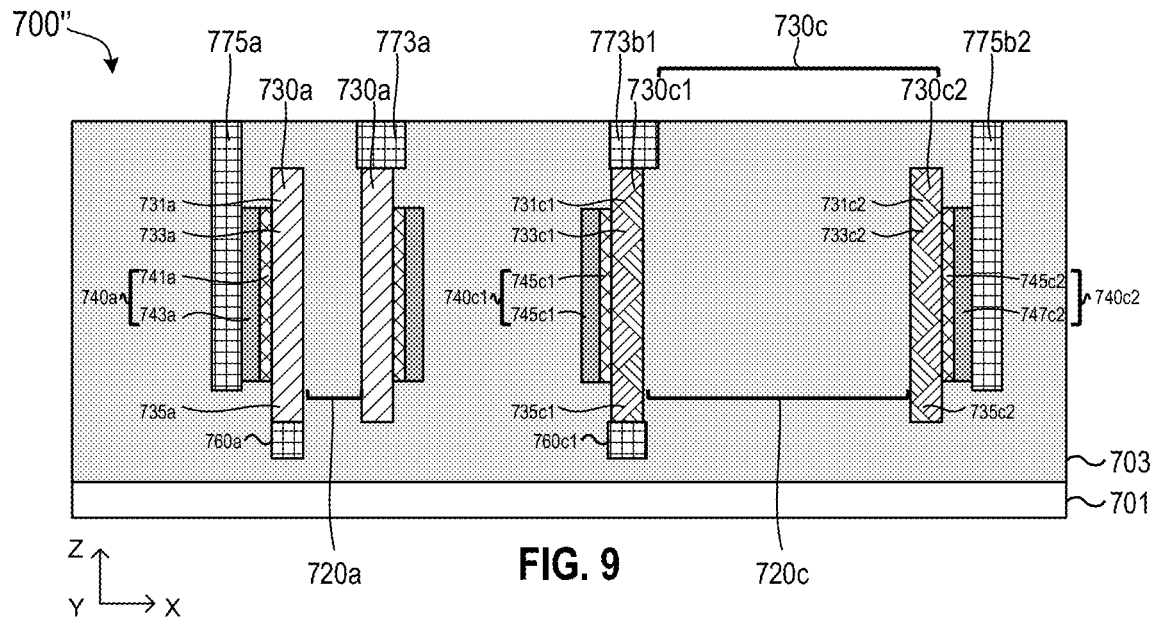
FIG. 9 shows a vertical cross-sectional view of a semiconductor device, in accordance with yet another embodiment of the present disclosure.

FIG. 9 shows a vertical cross-sectional view of a semiconductor device 700", in accordance with yet another embodiment of the present disclosure. The semiconductor device 700" in FIG. 9 is similar to the semiconductor device 700 in FIGS. 7A and 7B, except that a first group of the shell structures (e.g. 730a) is chemically different from a second group of the shell structures (e.g. 730c). Accordingly, a first group of the gates structures (e.g. 740a) is different from a second group of the gate structures (e.g. 740c1 and 740c2).

Figure 10:
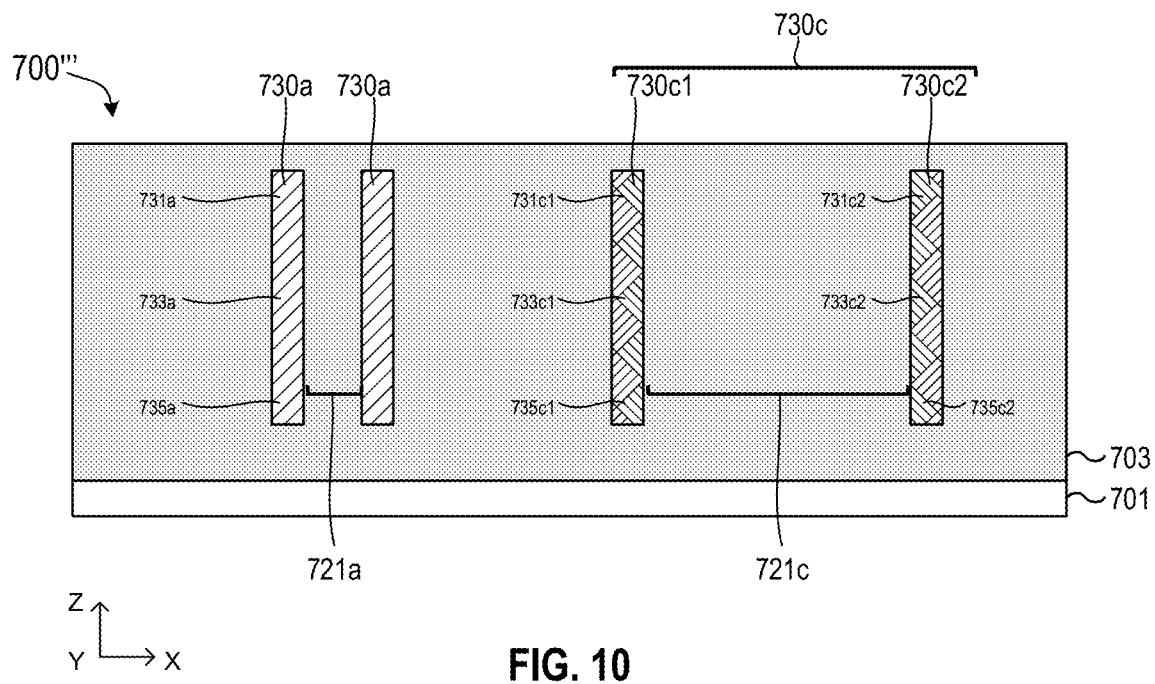
FIG. 10 shows a vertical cross-sectional view of a semiconductor device at an intermediate step of manufacturing, in accordance with yet another embodiment of the present disclosure.

FIG. 10 shows a vertical cross-sectional view of a semiconductor device 700''' at an intermediate step of manufacturing, in accordance with yet another embodiment of the present disclosure. In some embodiments, the semiconductor device 700''' can be used to form side-by-side CMOS vertical 3D semiconductor nano-transistors with integrated 3D dielectric core using vertical nanosheets for CMOS devices with 3D diffusion breaks. In some embodiments, the semiconductor device 700''' can eventually become the semiconductor device 700" in FIG. 9.

As shown in FIG. 10, the semiconductor device 700''' includes the first layer 701 and the shell structures 730a and 730c positioned above the first layer 701. The shell structures 730a and 730c can be electrically isolated from the first layer 701 by the dielectric material 703. As mentioned earlier, each shell structure is configured to include a top S/D region (e.g. 731a, 731c1 and 731c2), a channel region (e.g. 733a, 733c1 and 733c2) and a bottom S/D region (e.g. 735a, 735c1 and 735c2) serially connected in the vertical direction perpendicular to the first layer 701 and have a current flow path in the vertical direction. Further, the shell structures 730a and 730c include dielectric core structures 721a and 721c respectively.

While not shown, the semiconductor device 700''' can go through processes similar to FIGS. 8B-8G to form the gate structures (e.g. 740a, 740c1 and 740c2), except that a first group of gate structures (e.g. 740a) and a second group of gate structures (e.g. 740c1 and 740c2) are formed. In some embodiments, the first group of gate structures and the second group of gate structures can be formed by similar processes described in FIGS. 4B-4E.

Figure 11:
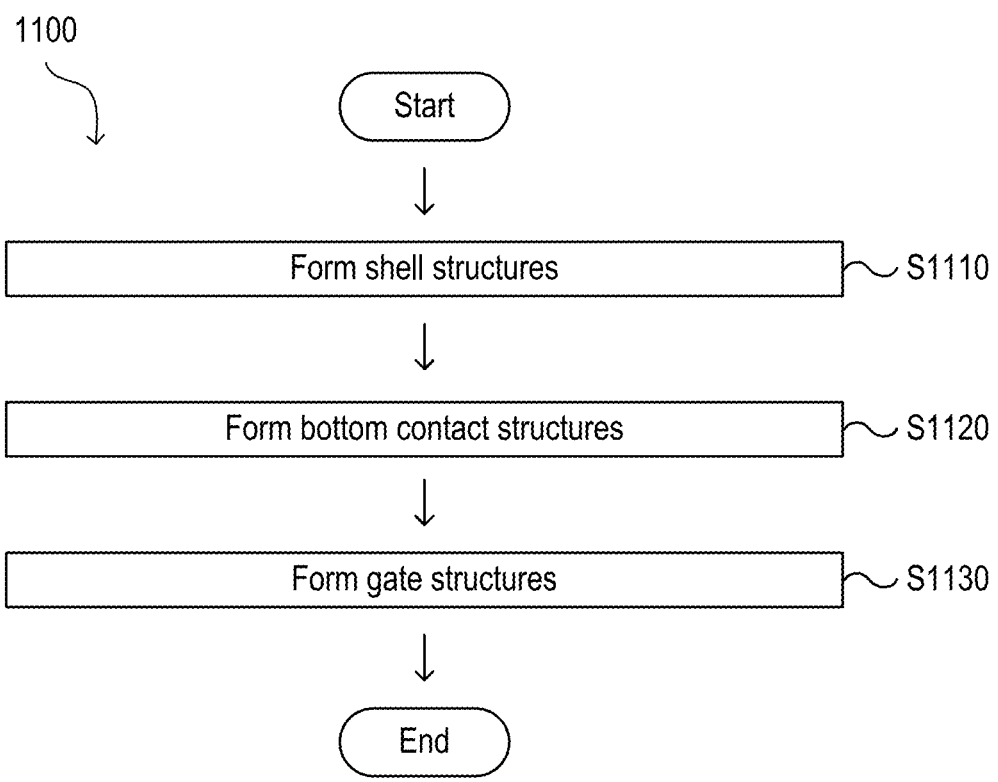
FIG. 11 shows a flow chart of an exemplary process for manufacturing an exemplary semiconductor device, in accordance with exemplary embodiments of the present disclosure.

FIG. 11 shows a flow chart of a process 1100 for manufacturing an exemplary semiconductor device, such as the semiconductor devices 100, 300, 500, 700, 700" and the like, in accordance with exemplary embodiments of the present disclosure.

The process 1100 starts with Step S1110 wherein shell structures are formed. In some embodiments, the shell structures are formed above a first layer including a first semiconductor material. The shell structures are electrically isolated from each other and electrically isolated from the first layer. The shell structures include at least one type of semiconductor material and each include a dielectric core structure. Each shell structure is configured to include a top S/D region, a channel region and a bottom S/D region serially connected in a vertical direction perpendicular to the first layer and have a current flow path in the vertical direction.

The process 1100 then proceeds to Step S1120 by forming bottom contact structures. Particularly, a bottom contact structure can be formed to connect to a respective bottom S/D region of each shell structure (e.g. FIGS. 2B-2E). At Step S1130, gate structures are formed. For example, a gate structure can be formed on a sidewall of a respective channel region of each shell structure (e.g. FIGS. 2F-2I, 4B-4E, 6B-6C and 8B-8F).

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of microfabrication, comprising:
    forming shell structures above a first layer including a first semiconductor material, the shell structures electrically isolated from each other and electrically isolated from the first layer, the shell structures including at least one type of semiconductor material and each including a dielectric core structure, wherein each shell structure is configured to include a top source/drain (S/D) region, a channel region and a bottom S/D region serially connected in a vertical direction perpendicular to the first layer and have a current flow path in the vertical direction;
    forming a bottom contact structure connected to a respective bottom S/D region of each shell structure;
    forming a gate structure on a sidewall of a respective channel region of each shell structure,
    forming first conductive structures configured to connect top S/D regions of the shell structures and gate structures to at least one of a front-side power delivery network (FSPDN) or a backside power delivery network (BSPDN); and
    forming second conductive structures configured to connect to bottom contact structures so that bottom S/D regions are configured to connect to at least one of the FSPDN or the BSPDN via respective second conductive structures and bottom contact structures.

2. The method of claim 1, wherein the forming the bottom contact structure comprises:
    forming an opening along a respective sidewall of each shell structure to expose a respective bottom S/D region of each shell structure;
    filling each opening with a conductive material such that a bottom portion of the conductive material is in contact with the respective bottom S/D region; and
    removing a top portion of the conductive material so that the bottom portion of the conductive material forms the bottom contact structure.

3. The method of claim 1, wherein the forming the gate structure comprises:
    exposing top S/D regions and channel regions of the shell structures;
    forming gate stacks around the channel regions;
    forming sidewall spacers around the top S/D regions; and
    removing excessive portions of the gate stacks at least partially using the sidewall spacers as an etching mask so that remaining portions of the gate stacks form the gate structures.

4. The method of claim 3, further comprising:
    removing a dielectric material that is positioned on an outer sidewall of at least one shell structure to expose a respective top S/D region and a respective channel region from outside; and
    forming an outer gate structure on an outer sidewall of the respective channel region.

5. The method of claim 3, further comprising:
    removing the dielectric core structure of at least one shell structure to expose a respective top S/D region and a respective channel region from inside; and
    forming an inner gate structure on an inner sidewall of the respective channel region.

6. The method of claim 3, further comprising:
depositing at least one high-k dielectric of the gate stacks around the channel regions and the top S/D regions;
depositing at least one work function metal (WFM) of the gate stacks, around the channel regions, on the high-k dielectric;
forming the sidewall spacers around the top S/D regions; and
removing the excessive portions of the at least one WFM at least partially using the sidewall spacers as the etching mask.

7. The method of claim 1, wherein the forming the gate structure comprises forming a first group of gate structures on respective channel regions of a first group of the shell structures and a second group of gate structures on respective channel regions of a second group of the shell structures, wherein:
the first group of gate structures and the second group of gate structures include different gate stacks, and
the first group of the shell structures and the second group of the shell structures include different semiconductor materials, or the first group of the shell structures and the second group of the shell structures include a same semiconductor material but are doped differently.

8. The method of claim 7, further comprising:
stepwise masking and uncovering the first group of the shell structures and the second group of the shell structures to form the first group of gate structures and the second group of gate structures.

9. The method of claim 8, further comprising:
forming the first group of gate structures on the respective channel regions of the first group of the shell structures to create NMOS transistors; and
forming the second group of gate structures on the respective channel regions of the second group of the shell structures to create PMOS transistors, the first group of the shell structures having a different semiconductor material from the second group of the shell structures.

10. The method of claim 1, wherein the forming the shell structures comprises:
providing a substrate having the first layer;
forming a second layer of a second semiconductor material over the first layer;
directionally etching the second layer using a mask to form independent core structures of the second semiconductor material on the first semiconductor material, wherein each independent core structure has a sidewall extending from an exposed surface of the first layer;
forming a third layer of a dielectric material on the exposed surface of the first layer to cover a lower portion of a respective sidewall of each core structure with the dielectric material;
forming a shell structure on an upper portion of a respective sidewall of each core structure to form the shell structures; and
replacing the core structures with an insulating material to form the dielectric core structure of each shell structure.

11. A method of microfabrication, comprising:
forming shell structures above a first layer including a first semiconductor material, the shell structures electrically isolated from each other and electrically isolated from the first layer, the shell structures including at least one type of semiconductor material and each including a dielectric core structure, wherein each shell structure is configured to include a top source/drain (S/D) region, a channel region and a bottom S/D region serially connected in a vertical direction perpendicular to the first layer and have a current flow path in the vertical direction;
forming a bottom contact structure connected to a respective bottom S/D region of each shell structure; and
forming a gate structure on a sidewall of a respective channel region of each shell structure,
wherein the forming the shell structure comprises forming at least one continuous shell structure surrounding a sidewall of a respective dielectric core structure such that the continuous shell structure forms a closed shape in a plane parallel to the first layer.

12. The method of claim 11, further comprising:
forming an outer gate structure all around an outer sidewall of a respective channel region of the continuous shell structure.

13. The method of claim 12, further comprising:
forming an inner gate structure all around an inner sidewall of the respective channel region of the continuous shell structure.

14. The method of claim 13, further comprising:
forming a conductive structure to electrically connect the outer gate structure and the inner gate structure of the respective channel region of the continuous shell structure.

15. A method of microfabrication, comprising:
forming shell structures above a first layer including a first semiconductor material, the shell structures electrically isolated from each other and electrically isolated from the first layer, the shell structures including at least one type of semiconductor material and each including a dielectric core structure, wherein each shell structure is configured to include a top source/drain (S/D) region, a channel region and a bottom S/D region serially connected in a vertical direction perpendicular to the first layer and have a current flow path in the vertical direction;
forming a bottom contact structure connected to a respective bottom S/D region of each shell structure; and
forming a gate structure on a sidewall of a respective channel region of each shell structure.

16. The method of claim 15, wherein the forming the shell structure comprises:
forming at least one discontinuous shell structure comprising independent sub-shell structures extending around a sidewall of a respective dielectric core structure such that the discontinuous shell structure forms a broken shape in a plane parallel to the first layer, each sub-shell structure configured to include a channel region.

17. The method of claim 16, further comprising:
forming an outer gate structure on an outer sidewall of a respective channel region of at least one sub-shell structure.

18. The method of claim 17, further comprising:
forming an inner gate structure on an inner sidewall of the respective channel region of the sub-shell structure.

19. The method of claim 18, further comprising:
forming the outer gate structure and the inner gate structure so that the outer gate structure and the inner gate structure are in contact and together surround the respective channel region of the sub-shell structure.

20. The method of claim 18, further comprising:
forming outer gate structures and inner gate structures on sidewalls of channel regions of an array of sub-shell structure so that neighboring inner gate structures merge to form common gate structures for neighboring channel regions and neighboring outer gate structures merge to form common gate structures for neighboring channel regions.

* * * * *